United States Patent
Arikan

(10) Patent No.: US 12,218,689 B1
(45) Date of Patent: Feb. 4, 2025

(54) METHODS AND APPARATUS FOR LENGTH-ADAPTIVE ENCODING OF POLAR CODES

(71) Applicant: Polaran Haberlesme Teknolojileri Anonim Sirketi, Ankara (TR)

(72) Inventor: Erdal Arikan, Ankara (TR)

(73) Assignee: Polaran Haberlesme Teknolojileri Anonim Sirketi, Cankaya (TR)

( * ) Notice: Subject to any disclaimer, the term of this patent is extended or adjusted under 35 U.S.C. 154(b) by 0 days.

(21) Appl. No.: 18/354,375

(22) Filed: Jul. 18, 2023

(51) Int. Cl.
  *H03M 13/00* (2006.01)
  *H03M 13/21* (2006.01)
  *H04L 1/00* (2006.01)

(52) U.S. Cl.
  CPC ......... *H03M 13/21* (2013.01); *H03M 13/611* (2013.01); *H04L 1/0057* (2013.01)

(58) Field of Classification Search
  None
  See application file for complete search history.

(56) References Cited

U.S. PATENT DOCUMENTS

| | | | |
|---|---|---|---|
| 2005/0094884 A1* | 5/2005 | Takishima | H04N 1/41 382/243 |
| 2007/0268834 A1 | 11/2007 | Buckley et al. | |
| 2010/0299575 A1 | 11/2010 | Roth et al. | |
| 2018/0103199 A1* | 4/2018 | Hendry | H04N 21/440227 |
| 2021/0211930 A1* | 7/2021 | Larsson | H04L 5/0044 |
| 2022/0385516 A1* | 12/2022 | Atungsiri | H04L 27/26025 |
| 2023/0033774 A1* | 2/2023 | Koike-Akino | H04L 27/36 |
| 2023/0056886 A1* | 2/2023 | Atungsiri | H04L 5/0005 |
| 2023/0199221 A1* | 6/2023 | Stoica | H04N 19/89 375/240.27 |
| 2023/0409877 A1* | 12/2023 | Koike Akino | G06N 3/08 |

OTHER PUBLICATIONS

"3rd Generation Partnership Project; Technical Specification Group Radio Access Network; NR; Multiplexing and channel coding (Release 16)", 3GPP TS 38.212 v16.4.0, Dec. 2020, 152 pgs.
Bioglio, V. et al., "Design of Polar codes in 5G New Radio", IEEE Communications Surveys & Tutorials, vol. 23, No. 1, First Quarter 2021, 12 pages.

(Continued)

*Primary Examiner* — Mujtaba M Chaudry

(57) ABSTRACT

Length-adapter input parameters for length-adaptive encoding include a data word length and a length-adapted codeword length, which are positive integers. Length-adapter output parameters include a primary data word length, a secondary data word length, a primary codeword length, and a secondary codeword length. A received data word is split according to splitter parameters into a primary data word based on the primary data word length and a secondary data word based on the secondary data word length. The primary data word is encoded in accordance with primary encoder parameters to generate a primary codeword from a primary code. The secondary data word is encoded in accordance with secondary encoder parameters to generate a secondary codeword from a secondary code. The primary and secondary codewords are combined in accordance with combiner parameters to generate a length-adapted codeword transmitted via a channel to a decoder.

20 Claims, 10 Drawing Sheets

(56) References Cited

OTHER PUBLICATIONS

International Search Report and Written Opinion of the International Searching Authority dated Oct. 24, 2024, in connection with International Application No. PCT/IB2024/056995, 19 pages.
Gabi Sarkis et al: "Flexible and Low-Complexity Encoding and Decoding of Systematic Polar Codes," IEEE Transactions on Communications, Feb. 2026, 13 pages.
Vangala Harish et al: "A new multiple folded successive cancellation decoder for polar codes," 2014 IEEE Information Theory Workshop, Dec. 2014, 5 pages.
International Search Report and Written Opinion of the International Searching Authority dated Oct. 24, 2024, in connection with the International Application No. PCT/IB2024/056995, 19 pages.

* cited by examiner

METHODS AND APPARATUS FOR LENGTH-ADAPTIVE ENCODING OF POLAR CODES

TECHNICAL FIELD

The present disclosure is directed generally to length-adaptive encoding of error correcting codes in a communication system, more specifically, to length-adaptive encoding of polar codes.

BACKGROUND

Length-adaptive encoding is a problem that arises when the desired length of an error correcting code is not equal to a natural length of the code. For example, polar codes in their native form have block lengths N that are powers of two, $N=2^n$, $n \geq 1$. Many applications require code block lengths that are far more flexible, necessitating length-adaptation.

The 5G NR standard [1,2] employs a length-adaptation method for polar codes in which the input to the length-adaptation algorithm comprises a pair of numbers (A, E) where A is a number of data bits to be encoded and E is a target length of a length-adapted codeword at the output of the algorithm. Unless E happens to be a power of two, the 5G length-adaptive encoding method chooses a block length $N=2^n$ as a function of (A, E), encodes the A data bits first into a length-N polar codeword, then applies length-adaptation ("rate-matching" in the terminology of 5G) to the polar codeword to obtain the length-adapted codeword. The method applies puncturing shortening, or extending (by repetition) to adjust the length of the polar codeword from N to E. Puncturing and shortening are employed when E<N; extending is employed when E>N. The 5G length-adaptation method is simple to implement but leaves room for significant performance improvement.

The present principles introduce a method to improve the performance of the 5G length-adaptive polar codes. Although the present principles target primarily polar codes, the scope of the present principles are not limited by polar codes only.

REFERENCES

[1] 3GPP TS 38.212 V16.4.0 (2020-12) 3$^{rd}$ Generation Partnership Project; Technical Specification Group Radio Access Network; NR; Multiplexing and channel coding (Release 16).
[2] V. Bioglio, C. Condo, and I. Land, "Design of Polar Codes in 5G New Radio," IEEE Communications Surveys and Tutorials, vol. 23, no. 1, pp. 2940, 2021.

The above-listed publications are incorporated herein by reference.

SUMMARY

Length-adapter input parameters for length-adaptive encoding include a data word length and a length-adapted codeword length, which are positive integers. Length-adapter output parameters include a primary data word length, a secondary data word length, a primary codeword length, and a secondary codeword length. A received data word is split according to splitter parameters into a primary data word based on the primary data word length and a secondary data word based on the secondary data word length. The primary data word is encoded in accordance with primary encoder parameters to generate a primary codeword from a primary code. The secondary data word is encoded in accordance with secondary encoder parameters to generate a secondary codeword from a secondary code. The primary and secondary codewords are combined in accordance with combiner parameters to generate a length-adapted codeword transmitted via a channel to a decoder.

In a first embodiment, a length-adaptive encoding method for use in a communication system includes receiving length-adapter input parameters and generating length-adapter output parameters. The length-adapter input parameters comprise a primary data word length $A_P$, a secondary data word length $A_S$, a primary codeword length $E_P$, and a secondary codeword length $E_S$. The data word length A and the length-adapted codeword length E are positive integers. The length-adapter output parameters satisfy either a first set of the conditions or a second set of conditions, where the first set of conditions comprise $A_P \leq A/2$, $A_S > 0$, $A_P + A_S = A$, $0 < E_P < E$, $0 < E_S \leq E$, and $E_P + E_S > E$, and the second set of conditions comprise $A_P = A$, $A_S = 0$, $E_P = E$, and $E_S = 0$. The first set of conditions are satisfied for a non-empty collection of the length-adapter input parameters. The method includes receiving a data word and splitting the data word in accordance with splitter parameters into a primary data word and a secondary data word. The splitter parameters comprise the primary data word length $A_P$ and the secondary data word length $A_S$. The method also includes encoding the primary data word in accordance with primary encoder parameters to generate a primary codeword from a primary code. The primary encoder parameters comprise the primary data word length $A_P$ and the primary codeword length $E_P$. The method further includes encoding the secondary data word in accordance with secondary encoder parameters to generate a secondary codeword from a secondary code. The secondary encoder parameters comprise the secondary data word length $A_S$ and the secondary codeword length $E_S$. The method still further includes combining the primary codeword and the secondary codeword in accordance with combiner parameters to generate a length-adapted codeword, and transmitting the length-adapted codeword via a channel to a decoder in the communication system. The combiner parameters comprise the primary codeword length $E_P$, the secondary codeword length $E_S$, and the length-adapted codeword length E.

In a second embodiment, an encoding apparatus for use in a communication system includes one or more processors and a transmitter. The one or more processors are configured as a length-adapter, to receive length-adapter input parameters and generate length-adapter output parameters. The length-adapter input parameters comprise a data word length A and a length-adapted codeword length E. The length-adapter output parameters comprise a primary data word length $A_P$, a secondary data word length $A_S$, a primary codeword length $E_P$, and a secondary codeword length $E_S$. The data word length A and the length-adapted codeword length E are positive integers. The length-adapter output parameters satisfy either a first set of the conditions or a second set of conditions, where the first set of conditions comprise $A_P \geq A/2$, $A_S > 0$, $A_P + A_S = A$, $0 < E_P < E$, $0 < E_S < E$, and $E_P + E_S > E$, and the second set of conditions comprise $A_P = A$, $A_S = 0$, $E_P = E$, and $E_S = 0$. The first set of conditions are satisfied for a non-empty collection of the length-adapter input parameters. The one or more processors are also configured as a splitter, to receive a data word and split the data word in accordance with splitter parameters into a primary data word and a secondary data word. The splitter parameters comprise the primary data word length $A_P$ and the secondary data word length $A_S$. The one or more processors are further configured as a primary encoder, to encode the primary data word in accordance with primary encoder parameters to generate a primary codeword from a primary code. The primary encoder parameters comprise the primary data word length $A_P$ and the primary codeword length $E_P$. The one or more processors are still further configured as a secondary encoder, to encode the secondary data word in accordance with secondary encoder parameters to generate a secondary codeword from a secondary code. The secondary encoder parameters comprise the secondary data word length $A_S$ and the secondary codeword length $E_S$. The one or more processors are further configured as a combiner, to combine the primary codeword and the secondary codeword in accordance with combiner parameters to generate a length-adapted codeword. The transmitter is configured to transmit the length-adapted codeword via a channel to a decoder in the communication system. The combiner parameters comprise the primary codeword length $E_P$, the secondary codeword length $E_S$, and the length-adapted codeword length E.

In any of the foregoing embodiments, the primary code may be a polar code.

In any of the foregoing embodiments, the secondary code may be a polar code.

In any of the foregoing embodiments, the primary codeword length $E_P$ equals a power of two.

In any of the foregoing embodiments, the secondary codeword length $E_S$ equals a power of two.

In any of the foregoing embodiments, the first set of conditions further comprise the condition $E_S=E$.

In any of the foregoing embodiments, the first set of conditions further comprise the conditions $0<A_S \leq \alpha$ and $E_P \leq E-A_S$, wherein a is a preconfigured positive constant.

In any of the foregoing embodiments, the secondary data word length $A_S$ is a function of the data word length A and the length-adapted codeword length E.

In any of the foregoing embodiments, the primary codeword or the secondary codeword is generated by recursive length-adapted splitting and encoding.

In any of the foregoing embodiments, the combiner may be configured to perform interleaving operations that permute coordinates of the primary codeword or the secondary codeword or both.

DETAILED DESCRIPTION

FIGS. 1 through 6D, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

We begin by defining some conventions and notation that are used throughout the present disclosure. We use script letters, such as $\mathcal{A}$, to denote sets. For any set $\mathcal{A}$, we write $\mathcal{A}^C$ to denote the complement of $\mathcal{A}$ in a specified universal set; we write $|\mathcal{A}|$ to denote the size (number of elements) of $\mathcal{A}$. We use lowercase boldface letters to denote vectors and uppercase boldface letters to denote matrices. By convention, we start indexing of vectors and matrices at zero. Given a vector $a=(a_0, a_1, \ldots, a_{m-1})$, we say that a has length m and refer to the set $\{0,1, \ldots, m-1\}$ as the index set of a; we refer to the element $a_i$ of a as the ith coordinate of a and to the integer i as the index of $a_i$. For any subset $\mathcal{A} \subset \{0,1, \ldots, m-1\}$ of indices of a, we write $a\mathcal{A}$ to denote the sub-vector $a\mathcal{A} = (a_i : i \in \mathcal{A})$ consisting of coordinates of a with indices in $\mathcal{A}$. By convention, we write the elements of $a\mathcal{A}$ in increasing index order (regardless of the order of the indices in the set $\mathcal{A}$). For example, for $a=(a_0, a_1, \ldots, a_7)$ and $\mathcal{A} = \{2,5,3,7,0\}$, the definition uniquely specifies $a\mathcal{A}$ as the vector $a\mathcal{A} = (a_0, a_2, a_3, a_5, a_7)$. The notation 0 denotes a vector all of whose coordinates are zero (an "all-zero" vector). We write $a\mathcal{A} = 0$ to indicate that the sub-vector $a\mathcal{A}$ is set to an all-zero vector of length $|\mathcal{A}|$.

Figure 1:
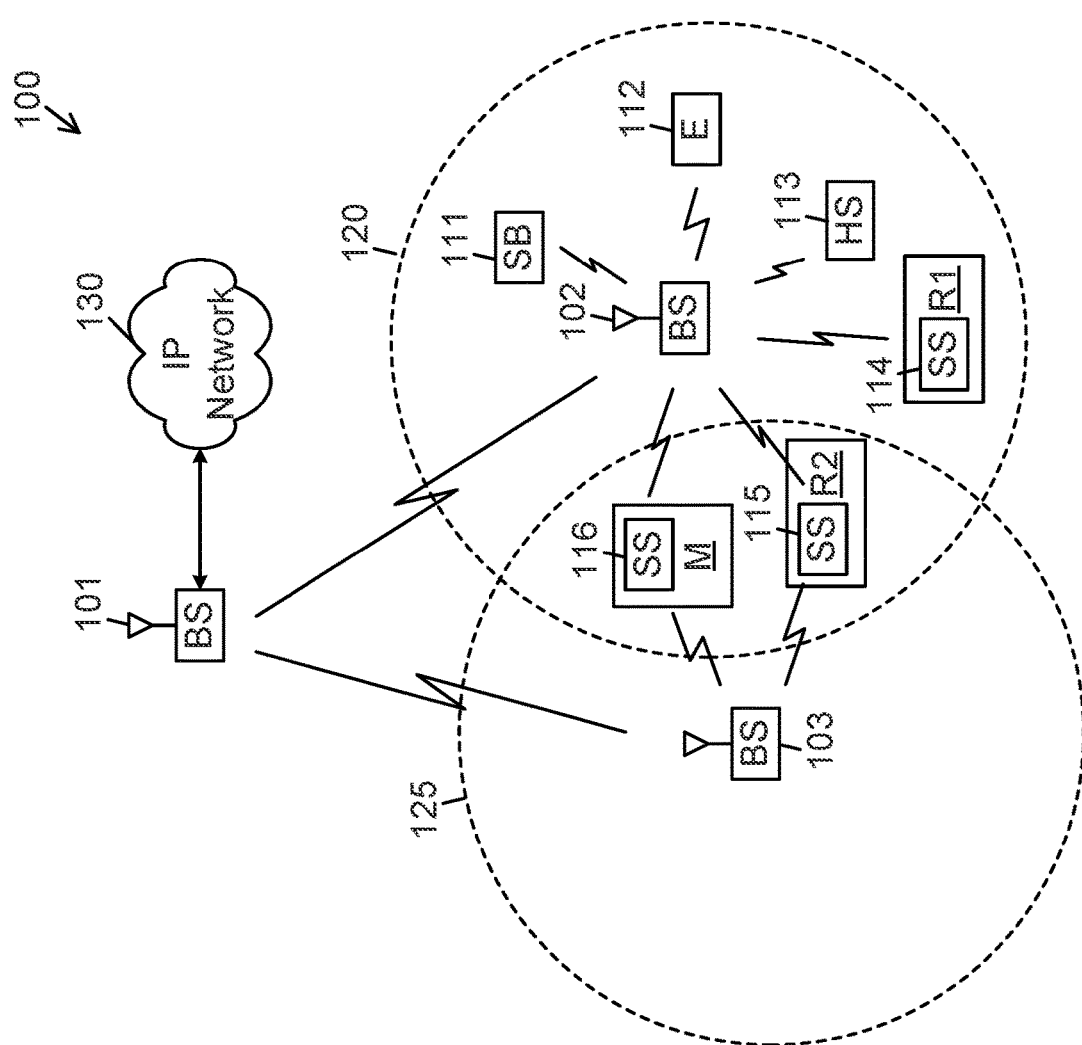
FIG. 1 is a schematic diagram of a wireless network in which embodiments of the present principles may be implemented according to certain aspects of the present disclosure.

FIG. 1 is a schematic diagram of a wireless network 100 in which embodiments of the present principles may be implemented according to certain aspects of the present disclosure. The wireless network 100 is for illustration only and does not limit the scope of the present disclosure. In particular, the present disclosure can be applied in wireline communication systems as well as wireless systems.

The wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

Depending on the network type, other well-known terms may be used instead of "eNodeB" or "eNB," such as "base station", "BS", "gNodeB", or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R1); a UE 115, which may be located in a second residence (R2); and a UE 116, which may be a mobile device (M) like a cell phone, a wireless laptop, a wireless personal digital assistant (PDA), tablet, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using WiFi, WiMAX, 3G, 4G, long-term evolution (LTE). LTE-A, 5G, or other present or future advanced wireless communication techniques.

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of eNB 101, eNB 102 and eNB 103 include 2D antenna arrays that can be used in conjunction with embodiments of the present disclosure. In some embodiments, one or more of eNB 101, eNB 102 and eNB 103 support the codebook design and structure for systems having 2D antenna arrays.

Although FIG. 1 illustrates one example of the wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

The embodiments of the present principles depicted in the figures and described below may be implemented in an eNB (such as eNB 102) and/or a UE (such as UE 116), as described in further detail below.

Figure 2A:
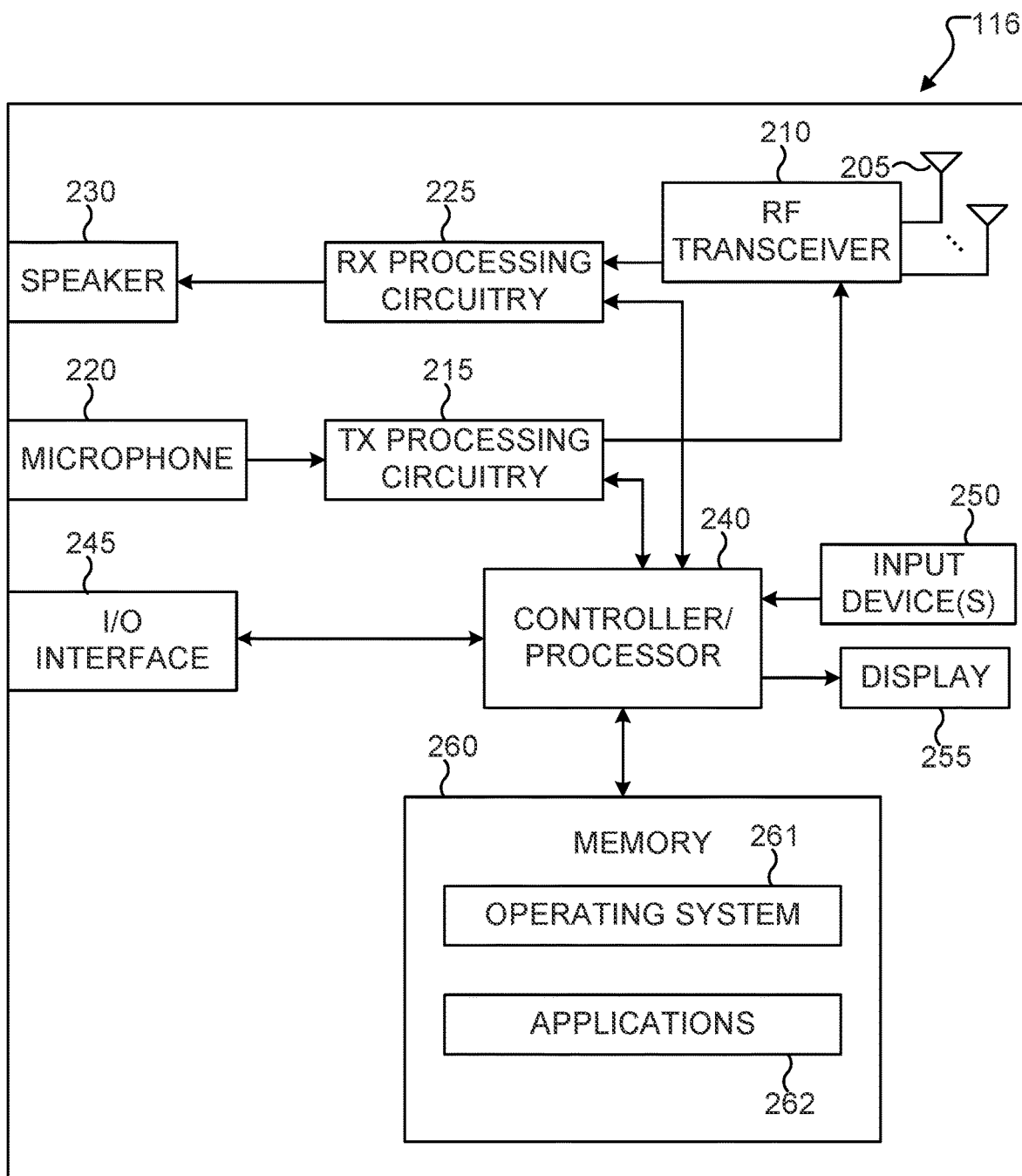
FIG. 2A illustrates an example user equipment (UE) in which embodiments of the present principles may be implemented according to certain aspects of the present disclosure.

FIG. 2A illustrates an example user equipment (UE) 116 in which embodiments of the present principles may be implemented according to certain aspects of the present disclosure. The embodiment of the UE 116 illustrated in FIG. 2A is for illustration only, and the UEs 111-116 of FIG. 1 could have the same or similar configuration. However, UEs come in a wide variety of configurations, and FIG. 2A does not limit the scope of the present disclosure to any particular implementation of a UE.

The UE 116 includes an antenna 205, a radio frequency (RF) transceiver 210, a transmit (TX) processing circuitry 215, a microphone 220, and a receive (RX) processing circuitry 225. The UE 116 also includes a speaker 230, a controller/processor 240, an input/output (I/O) interface 245, input device(S) 250 (such as a keypad), a display 255, and a memory 260. The memory 260 includes a basic operating system(OS) program 261 and one or more applications 262. Either the OS program 261, one of the applications 262, or some combination thereof may implement programming for employing the present principles as described in the various embodiments herein.

The RF transceiver 210 receives, from the antenna 205, an incoming RF signal transmitted by an eNB of the network 100. The RF transceiver 210 may down-convert the incoming RF signal to generate an intermediate frequency (IF) or baseband signal which would be sent to the RX processing circuitry 225. The RX processing circuitry 225 transmits the processed signal to the speaker 230 (such as for voice data) or to the controller/processor 240 for further processing (such as for web browsing data).

The TX processing circuitry 215 receives, as at least some input data for the source data block, analog or digital voice data from the microphone 220 or other outgoing baseband data (such as web data, e-mail, or interactive video game data) from the controller/processor 240. The RF transceiver 210 receives the outgoing processed baseband or IF signal from the TX processing circuitry 215 and up-converts the baseband or IF signal to an RF signal that is transmitted via the antenna 205.

The controller/processor 240 can include one or more processors or other processing devices and execute the basic OS program 261 stored in the memory 260 in order to control the overall operation of the UE 116. For example, the controller/processor 240 could control the reception of forward channel signals and the transmission of reverse channel signals by the RF transceiver 210, the RX processing circuitry 225, and the TX processing circuitry 215 in accordance with well-known principles. In some embodiments, the controller/processor 240 includes at least one programmable microprocessor or microcontroller, while in other embodiments the main processor includes dedicated circuitry as well as (optionally) programmable logic or processing circuits.

The controller/processor 240 is also capable of executing other processes and programs resident in the memory 260, such as operations for channel quality measurement and reporting for systems having 2D antenna arrays. The controller/processor 240 can move data and/or instructions into or out of the memory 260 as required by an executing process. In some embodiments, the controller/processor 240 is configured to execute the applications 262 based on the OS program 261 or in response to signals received from eNBs or an operator. The controller/processor 240 is also coupled to the I/O interface 245, which provides the UE 116 with the ability to connect to other devices such as laptop computers and handheld computers. The I/O interface 245 is the communication path between these accessories and the controller/controller 240.

The controller/processor 240 is also coupled to the input device(S) 250 (which may simply be a single button or may be an array or other set of buttons) and the display 255. The operator of the UE 116 can use the input device(S) 250 to enter data into the UE 116. The display 255 may be a touch screen display or other display capable of rendering text and/or at least limited graphics, such as from web sites, and receiving touch inputs by a user in accordance with known practices.

The memory 260 is coupled to the controller/processor 240, and at least a part of the memory 260 could include a random-access memory (RAM), and another part of the memory 260 could include a Flash memory or other read-only memory (ROM).

Although FIG. 2A illustrates one example of the UE 116, various changes may be made to FIG. 2A. For example, various components in FIG. 2A could be combined, further subdivided, or omitted and additional components could be added according to particular needs. As a particular example, the controller/processor 240 could be divided into multiple processors, such as one or more central processing units (CPUs), one or more application specific integrated circuits (ASICs), one or more field programmable gate arrays (FPGAs), and one or more graphics processing units (GPUs). Also, while FIG. 2A illustrates the UE 116 configured as a mobile telephone or smartphone, UEs could be configured to operate as other types of mobile or stationary devices.

Figure 2B:
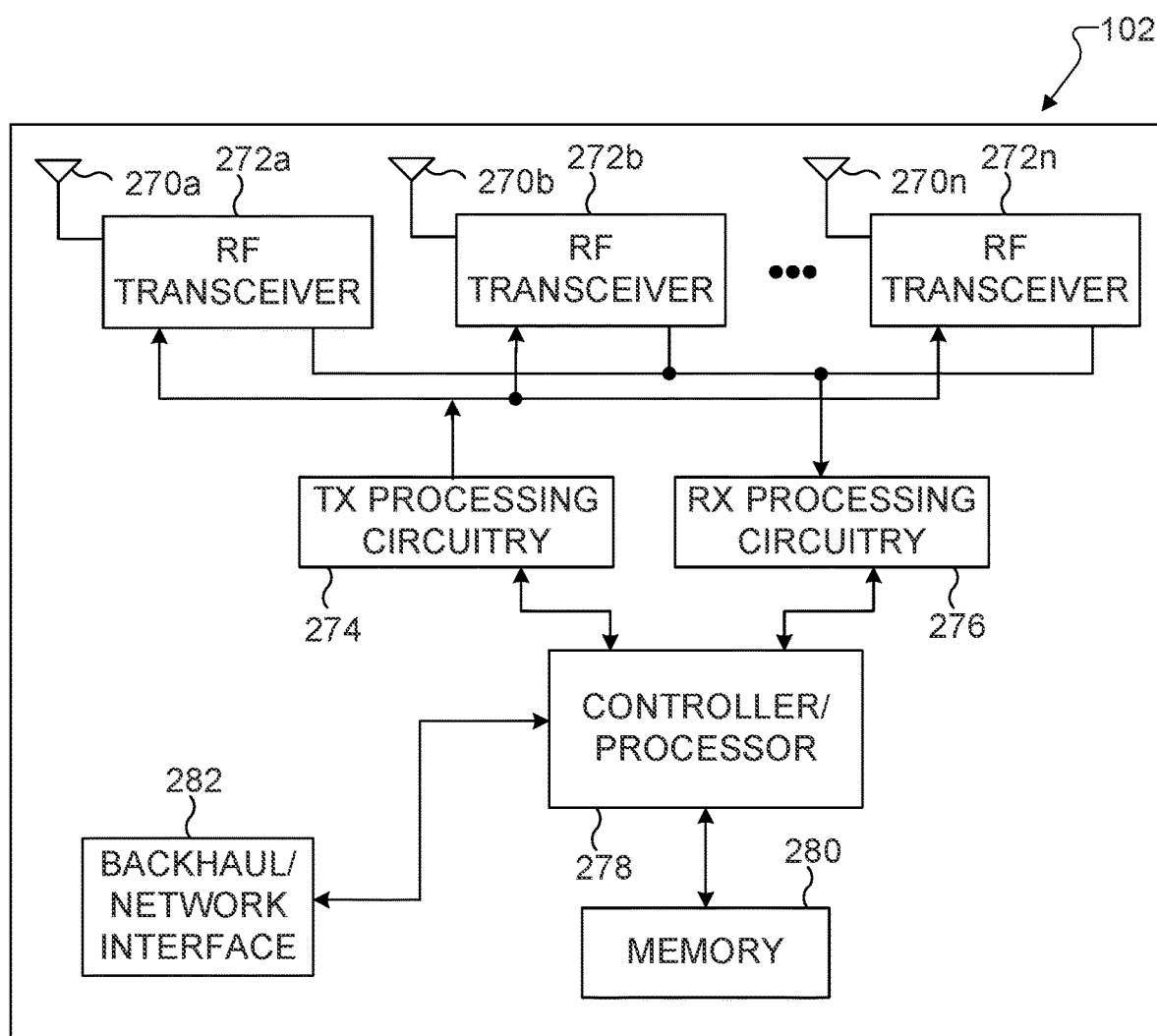
FIG. 2B illustrates an example of an enhanced NodeB (eNB) in which embodiments of present principles may be implemented according to certain aspects of the present disclosure.

FIG. 2B illustrates an example of an enhanced NodeB (eNB) 102 in which embodiments of present principles may be implemented according to certain aspects of the present disclosure. The embodiment of the eNB 102 shown in FIG. 2B is for illustration only, and other eNBs of FIG. 1 could have the same or similar configuration. However, eNBs come in a wide variety of configurations, and FIG. 2B does not limit the scope of the present disclosure to any particular implementation of an eNB. It is noted that the eNB 101 and the eNB 103 can include the same or similar structure as the eNB 102.

As shown in FIG. 2B, the eNB 102 includes multiple antennas 270a-270n, multiple RF transceivers 272a-272n, a transmit (TX) processing circuitry 274, and a receive (RX) processing circuitry 276. In certain embodiments, one or more of the multiple antennas 270a-270n include 2D antenna arrays. The eNB 102 also includes a controller/processor 278, a memory 280, and a backhaul or network interface 282.

The RF transceivers 272a-272n receive, from the antennas 270a-270n, incoming RF signals, such as signals transmitted by UEs or other eNBs. The RF transceivers 272a-272n down-convert the incoming RF signals to generate IF or baseband signals. The IF or baseband signals are sent to the RX processing circuitry 276, which generates processed signals by filtering, decoding, and/or digitizing the baseband or IF signals. The RX processing circuitry 276 transmits the processed signals to the controller/processor 278 for further processing.

The TX processing circuitry 274 receives at least some input data. The TX processing circuitry 274 implements circuits to encode, multiplex, and/or digitize the outgoing baseband data to generate processed signals. The RF transceivers 272a-272n receive the outgoing processed signals from the TX processing circuitry 274 and up-converts the baseband or IF signals to RF signals that are transmitted via the antennas 270a-270n.

The controller/processor 278 can include one or more processors or other processing devices that control the overall operation of the eNB 102. For example, the controller/processor 278 could control the reception of forward channel signals and the transmission of reverse channel signals by the RF transceivers 272a-272n, the RX processing circuitry 276, and the TX processing circuitry 274 in accordance with well-known principles. The controller/processor 278 could support additional functions as well, such as more advanced wireless communication functions. Any of a wide variety of other functions could be supported in the eNB 102 by the controller/processor 278. In some embodiments, the controller/processor 278 includes at least one microprocessor or microcontroller, while in other embodiments the main processor includes dedicated circuitry (e.g., for controlling encoding and decoding processes, code puncturing and/or shortening processes, data mapping, etc.) as well as (optionally) programmable logic or processing circuits.

The controller/processor 278 is also capable of executing programs and other processes resident in the memory 280, such as a basic OS. The controller/processor 278 is also capable of supporting channel quality measurement and reporting for systems having 2D antenna arrays. In some embodiments, the controller/processor 278 supports communications between entities. The controller/processor 278 can move data and/or instructions into or out of the memory 280 as required by an executing process.

The controller/processor 278 is also coupled to the backhaul or network interface 282. The backhaul or network interface 282 allows the eNB 102 to communicate with other devices or systems over a backhaul connection or over a network. The interface 282 could support communications over any suitable wired or wireless connection(S). For example, when the eNB 102 is implemented as part of a cellular communication system (such as one supporting 3G, 4G, 5G, LTE, or LTE-A), the interface 282 could allow the eNB 102 to communicate with other eNBs over a wired or wireless backhaul connection. When the eNB 102 is implemented as an access point, the interface 282 could allow the eNB 102 to communicate over a wired or wireless local area network or over a wired or wireless connection to a larger network (such as the Internet). The interface 282 includes any suitable structure supporting communications over a wired or wireless connection, such as an Ethernet or RF transceiver.

The memory 280 is coupled to the controller/processor 278. Part of the memory 280 could include a RAM, and another part of the memory 280 could include a Flash memory or other ROM. In certain embodiments, a plurality of instructions is stored in memory. The instructions are configured to cause the controller/processor 278 to perform the systematic and/or non-systematic encoding or decoding processes, shortening processes, data mapping, etc.

Although FIG. 2B illustrates one example of the eNB 102, various changes may be made to FIG. 2B. For example, the eNB 102 could include any number of each component show-n. As a particular example, an access point could include a number of interfaces 282, and the controller/processor 278 could support routing functions to route data between different network addresses. As another particular example, while shown as including a single instance of the TX processing circuitry 274 and a single instance of the Rx processing circuitry 276, the eNB 102 could include multiple instances of each (such as one per RF transceiver).

Figure 3:
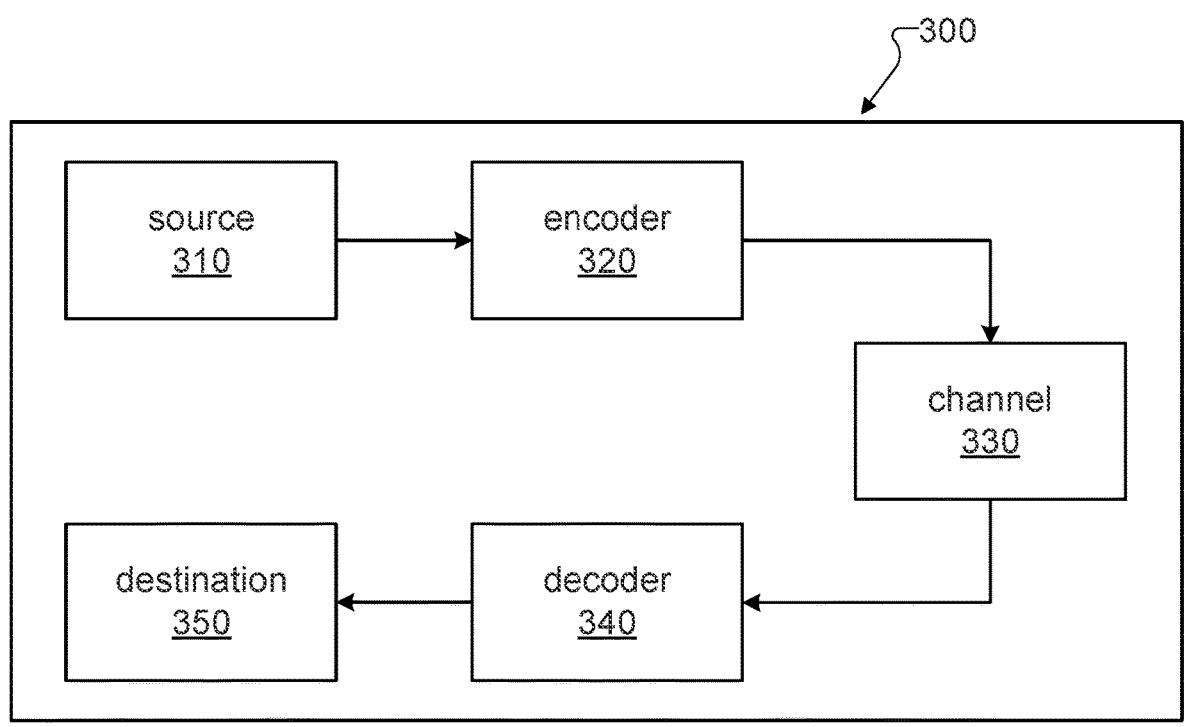
FIG. 3 is a block diagram illustrating a communication system in which embodiments of the present principles may be implemented according to certain aspects of the present disclosure.

FIG. 3 is a block diagram illustrating a communication system 300 in which embodiments of the present principles may be implemented according to certain aspects of the present disclosure, wherein the communication system 300 comprises a source 310, an encoder 320 connected to the source, a channel 330 connected to the encoder 320, a decoder 340 connected to the channel 330, and a destination 350 connected to the decoder 340.

For example, the source 310 could be the microphone 220, the I/O interface 245 (such as a keyboard), the controller/processor 240 (for example, sending protocol messages), or the applications 262 of FIG. 2A. The source 310 could also be the controller/processor 278 or the backhaul/network interface 282 of FIG. 2B. The destination 350 could be the speaker 230, the I/O interface 245 (such as a screen), or the controller/processor 278 (for example, receiving channel state information from a UE). These source-channel examples are given for illustrating some usage scenarios in which the present principles may be implemented; they do not limit the scope of the present disclosure to any particular type of usage scenario.

The source 310 generates a data word d sought to be communicated without error to the destination 350. The data word may be a segment of digitized speech, sensor data, web data, a document, protocol information, a combination thereof, or the like. The encoder 320 receives the data word, encodes the data word in accordance with an error correcting code to obtain a codeword x, and transmits the codeword over the channel 330 by applying the codeword to a channel input terminal. The channel accepts the codeword at the channel input terminal and produces a received word y at a channel output terminal. The decoder 340 receives the received word from the channel 330 at the channel output terminal, decodes the received word to generate a data word decision $\hat{d}$, and sends the data word decision to the destination 350.

The channel 330 may be any type of physical medium that can carry data from one point to another in space (airwaves, fiber-optic or metallic cables, etc.) or in time (hard disks, flash memory, random access memory, etc.). These examples of channels are given to illustrate the potential uses of the present principles without implying any limitation of the scope of the present disclosure.

The present disclosure regards any signal processing function at the transmit or receive side of the channel 330 as an integral part of the channel. Typically, such functions comprise modulation, demodulation, synchronization, equalization, amplification, channel estimation, etc. The present principles can be applied to any type of wireless or wireline communication system 300 provided that the channel 330 is equipped with transmitter functions that translate a codeword x at the channel input to signals that are sent over a physical medium and receiver functions that translate the received (noisy) signals back to a received word y at the channel output.

The data word d, the codeword x, the received word y, and the data word decision $\hat{d}$ are typically represented as vectors over their respective alphabets. Ordinarily, the data word decision takes values over the same alphabet as the data word, but the data word decision may take on additional values that may indicate abnormal decoder termination conditions such as decoder failure, decoder time-out, etc. A decoding error is said to occur if the data word decision $\hat{d}$ differs from the data word d in any coordinate. The present principles are about constructing practical methods and apparatus for error correcting codes with high reliability as measured by the probability of decoding error, denoted $P_e$ $\underline{\underline{def}}$ Pr ($\hat{d} \neq d$).

Prior art contains various types of error correcting codes that can be used in the system 300. In preferred embodiments of the present principles, a block code is employed in the system 300. A block code C is defined by a pair of length parameters (A, E), a pair of alphabets ($\mathcal{D}$, $\mathcal{X}$), and an encoder mapping $e: \mathcal{D}^A \to \mathcal{X}^E$, where A is a data word length, E is a codeword length, $\mathcal{D}$ is a data word alphabet, and $\mathcal{X}$ is a codeword alphabet. The encoder mapping associates a codeword $x=(x_0, \ldots, x_{E-1}) \in \mathcal{X}^E$ with each data word $d=(d_0, \ldots, d_{A-1}) \in \mathcal{D}^A$ by computing $x=e(d)$. Here, the alphabets $\mathcal{D}$ and $\mathcal{X}$ are finite sets that are otherwise arbitrary. We call a block code binary if $|\mathcal{X}|=2$, say $\mathcal{X}=\{0,1\}$. A block code with data word length A over an alphabet $\mathcal{X}$ contains $|\mathcal{X}|^A$ codewords.

A block code is called linear if $\mathcal{D}^A$ and $\mathcal{X}^E$ are vector spaces and the encoder mapping $e: \mathcal{D}^A \to \mathcal{X}^E$ is a linear transformation, i.e., $e(d+d')=e(d)+e(d')$ for any two data words d and d', where "+" denotes vector addition in the corresponding vector spaces. The encoder mapping for a linear block code can be represented as a matrix operation x=dG for some "generator matrix" G with A rows and E columns. Every linear code contains an all-zero codeword. We will be interested mainly in binary linear block codes, with $\mathcal{D} = \mathcal{X} = \{0,1\}$.

The present principles are concerned mainly with polar codes, which is a type of linear block code. A polar code in its basic form has an encoder mapping that comprises a polar transform G, where G is given by a Kronecker-power $G=F^{\otimes n}$ of a kernel matrix $$F = \begin{bmatrix} 1 & 0 \\ 1 & 1 \end{bmatrix}$$

for some integer $n \geq 1$. Given a data word d, the encoder for such a polar code prepares a transform input u by setting $u_Q=d$ and $u_{Q^c}=0$, and obtains the codeword by computing the polar transform x=uG, where $Q \subset \{0,1, \ldots, N-1\}$ is called a "polarization index set" and determines the coordinates of the transform input u that carry data.

In addition to the above basic version, the present principles are compatible with other versions of polar coding that comprise various parity-check insertion and/or interleaving operations, such as those used in 5G polar coding. Other types of polar codes within the scope of the present principles include systematic polar codes, non-binary polar codes, and polar codes with mixed kernels. A polar code is called systematic if the encoding is arranged so that the data word d appears transparently as part of the codeword x. A polar code is called non-binary if the codeword alphabet $\mathcal{X}$ has more than two elements. A mixed-kernel polar code is one for which the polar transform is given by a Kronecker product $G=F_1 \otimes F_2 \otimes \ldots \otimes F_n$ of a plurality of (not necessarily identical) kernel matrices $F_i$, $1 \leq i \leq n$. Prior art also includes polar transform matrices that are obtained by permuting the rows or columns of the polar transform matrices mentioned above. The present principles are applicable to polar codes defined by any such variation of the polar transform matrix. Unless otherwise specified, we use the term "polar code" to encompass all such variations of polar codes.

In the following, we will use distance properties and weight enumerators of various codes for performance analysis. For any two codewords $x=(x_0, x_1, \ldots, x_{E-1})$ and $x'=(x_0', x_1', \ldots, x_{E-1}')$ in a block code, the Hamming distance $d_H(x, x')$ is defined as the number of coordinates in which they differ, i.e., $d_H(x, x') \underline{\underline{def}} |\{i \in \{0,1, \ldots, E-1\}: x_i \neq x_i'\}|$. A measure of quality for a block code is the code minimum distance d*, defined as the minimum of the Hamming distances $d_H(x, x')$ over all pairs of codewords x=e(d) and x'=e(d') corresponding to distinct data words $d \neq d'$. Ordinarily, the encoder mapping for a block code is invertible and the minimum distance d* is greater than zero.

For linear block codes, distances can be studied in terms of Hamming weights of codewords. The Hamming weight of a codeword $x=(x_0, x_1, \ldots, x_{E-1})$ is defined as $w_H(x)\underline{\underline{def}}$ $|\{i \in \{0,1, \ldots, E-1\}: x_i \neq 0\}|$. Thus, in a linear block code, the Hamming distance between any two codewords is given by $d_H(x, x')=d_H(x+x', 0)=w_H(x+x')$.

The weight enumerator of a linear block code is defined as the polynomial $$W(D) \stackrel{def}{=} \sum_{d=0}^{E} a_d D^d,$$

where D is an indeterminate, $a_d$ is the number of codewords at Hamming distance d from the all-zero codeword, and E is the code block length. Here, the count of codewords for $a_0$ includes the all-zero codeword. Thus, $$W(1) = \sum_{d=0}^{E} a_d = M$$

where $M\underline{\underline{def}} \, \mathcal{X}^A$ is the number of codewords in the code. Ordinarily, all codewords are distinct, $a_0=1$, and the weight enumerator can be written as $$W(D) = 1 + \sum_{d=d^*}^{E} \cdot a_d D^d,$$

where d*>0 is the code minimum distance. When d*>0, we will refer to the term $a_{d^*}D^{d^*}$ as the "minimum distance" term of the weight enumerator. Codes with d*=0 are of no practical use and will not be of interest in the following.

To illustrate the performance of various embodiments of the present principles, we will use examples below in which the channel 330 is modeled as a binary-input memoryless channel. A binary-input memoryless channel is characterized by a channel input alphabet $\mathcal{X}=\{0,1\}$, a channel output alphabet $\mathcal{Y}$, and an arbitrary set of transition probabilities $\{P(y|x): x \in \mathcal{X}, y \in \mathcal{Y}\}$ (if $\mathcal{Y}$ is discrete) or transition probability densities $\{P(y|x): x \in \mathcal{X}, y \in \mathcal{Y}\}$ (if $\mathcal{Y}$ is continuous). For a memoryless channel, the conditional probability of receiving $y=(y_0, \ldots, y_{E-1}) \in \mathcal{Y}^E$ given that a codeword $x=(x_0, \ldots, x_{E-1}) \in \mathcal{X}^E$ is transmitted is given by $P(y|x)=\Pi_{i=0}^{E-1}P(y_i|x_i)$ or $p(y|x)=\Pi_{i=0}^{E-1}p(y_i|x_i)$, depending on whether $\mathcal{Y}$ is discrete or continuous, respectively.

An example of a binary-input memoryless channel is the binary symmetric channel (BSC) for which $\mathcal{X}=\mathcal{Y}=\{0,1\}$ and $P(y|x)=1-\varepsilon$ if y=x and $P(y|x)=\varepsilon$ if y≠x, where $\varepsilon$ is a "crossover" probability, satisfying $0\leq\varepsilon\leq\frac{1}{2}$. Another example of a binary-input memoryless channel is the binary-input additive white gaussian noise (BI-AWGN) channel for which $\mathcal{X}=\{0,1\}$, $\mathcal{Y}=(-\infty, \infty)$, and $$p(y|0) = \frac{1}{\sqrt{2\pi\sigma^2}} e^{-\frac{(y-\alpha)^2}{2\sigma^2}}$$

and $$p(y|1) = \frac{1}{\sqrt{2\pi\sigma^2}} e^{-\frac{(y+\alpha)^2}{2\sigma^2}},$$

where $\alpha$ is a signal amplitude and $\sigma^2>0$ is a noise variance. For the BI-AWGN channel model here, the channel comprises a "modulator" that maps the channel input $x \in \mathcal{X}=\{0,1\}$ to the signal amplitude $+\alpha$ if x=0 and $-\alpha$ if x=1.

The Bhattacharyya parameter of a binary-input memoryless channel is defined as $Z\underline{\underline{def}} \, \Sigma_{y \in \mathcal{Y}}\sqrt{P(y|0)P(y|1)}$ or $$Z \stackrel{def}{=} \int_{-\infty}^{\infty} \sqrt{p(y|0)p(y|1)} \, dy$$

depending on whether $\mathcal{Y}$ is discrete or continuous. For example, $Z=2\sqrt{\varepsilon(1-\varepsilon)}$ for the BSC and $$Z = e^{-\frac{\alpha^2}{2\sigma^2}}$$

for the BI-AWGN channel. In general, the Bhattacharyya parameter satisfies $0 \leq Z \leq 1$. The cutoff rate of a binary-input memoryless channel is defined as $R_0\underline{\underline{def}} 1-\log_2(1+Z)$.

Union bound. Consider the system 300. Let the encoder 310 implement a binary linear block code with length parameters (A, E) and a weight enumerator W(D). Let the channel 330 be modeled as a binary-input memoryless channel with Bhattacharyya parameter Z. Let the decoder 340 be a maximum-likelihood (ML) decoder and let $P_e$ denote the probability of decoding error. The well-known union bound states that $P_e \leq W(Z)-1$.

Union bound (random-coding version). Consider the average of the above union bound over an ensemble of all binary linear block codes with length parameters (A, E). Let $\overline{P}_e$ denote the ensemble average of $P_e$. Standard random-coding techniques show that the union becomes $\overline{P}_e \leq (M-1)2^{-ER_0}$, where $M=2^A$ is the number of codewords in the code, and $R_0$ is the channel cutoff rate.

In general, computing the union bound for a given code is an intractable task. The minimum-distance term $a_{d^*}\cdot Z^{d^*}$ may serve as a good approximation to the union bound if the Bhattacharyya parameter Z is sufficiently small (e.g., at high SNR in a BI-AWGN channel). The cutoff rate bound is a computationally tractable alternative to the deterministic version of the union bound. We use these bounds in the following to estimate the performance attainable by the present principles.

This completes the review of coding theory background. We now turn to specific aspects of the present principles.

Figure 4A:
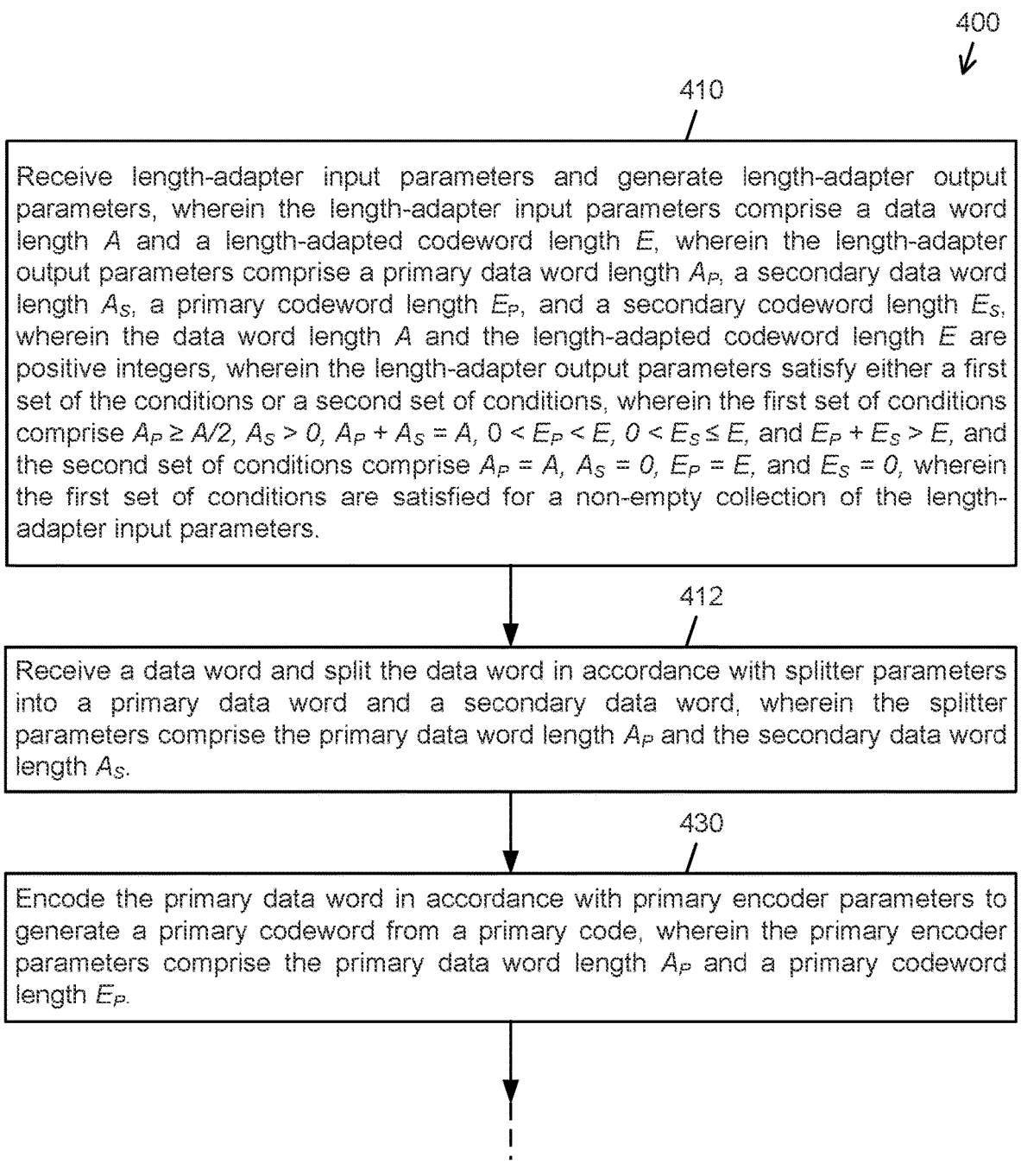
FIGS. 4A and 4B are a flowchart of a length-adaptive encoding method according to certain aspects of the present disclosure.
Figure 4B:
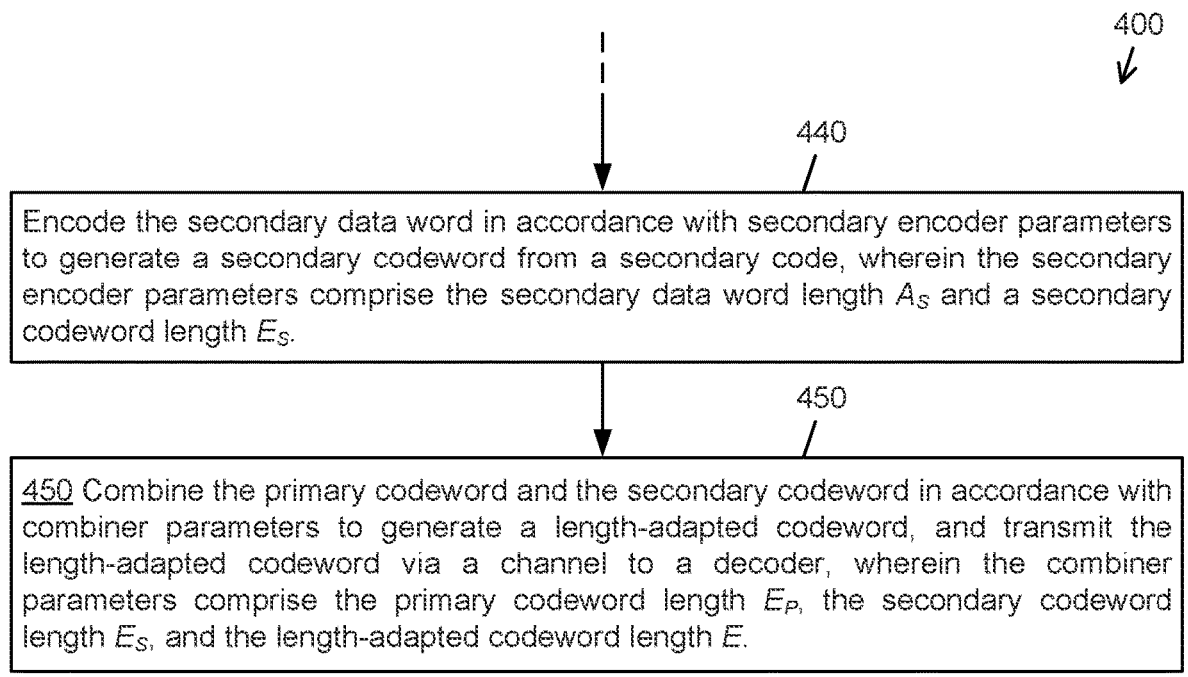

FIGS. 4A and 4B are a flowchart of a length-adaptive encoding method 400 according to certain aspects of the present disclosure, wherein the method 400 comprises the following steps.

Length-adapter step 410: Receive length-adapter input parameters and generate length-adapter output parameters, wherein the length-adapter input parameters comprise a data word length A and a length-adapted codeword length E, wherein the length-adapter output parameters comprise a primary data word length $A_P$, a secondary data word length $A_S$, a primary codeword length $E_P$, and a secondary codeword length $E_S$, wherein the data word length A and the length-adapted codeword length E are positive integers, wherein the length-adapter output parameters satisfy either a first set of the conditions or a second set of conditions, wherein the first set of conditions comprise $A_P \geq A/2$, $A_S>0$, $A_P+A_S=A$, $0<E_P<E$, $0<E_S \leq E$, and $E_P+E_S>E$, and the second set of conditions comprise $A_P=A$, $A_S=0$, $E_P=E$, and $E_S=0$, wherein the first set of conditions are satisfied for a non-empty collection of the length-adapter input parameters.

Splitter step 420: Receive a data word and split the data word in accordance with splitter parameters into a primary data word and a secondary data word, wherein the splitter parameters comprise the primary data word length $A_P$ and the secondary data word length $A_S$.

Primary encoder step 430: Encode the primary data word in accordance with primary encoder parameters to generate a primary codeword from a primary code, wherein the primary encoder parameters comprise the primary data word length $A_P$ and the primary codeword length $E_P$.

Secondary encoder step 440: Encode the secondary data word in accordance with secondary encoder parameters to generate a secondary codeword from a secondary code, wherein the secondary encoder parameters comprise the secondary data word length $A_S$ and the secondary codeword length $E_S$.

Combiner step 450: Combine the primary codeword and the secondary codeword in accordance with combiner parameters to generate a length-adapted codeword and transmit the length-adapted codeword via a channel to a decoder, wherein the combiner parameters comprise the primary codeword length $E_P$, the secondary codeword length $E_S$, and a length-adapted codeword length E.

We now return to step 410 and discuss the conditions on the length parameters.

The parameters A and E are assumed to satisfy the conditions A>0 and E>0, as one would expect in any non-trivial coding situation. In fact, in preferred embodiments of the present principles, one may impose further conditions such as $A_{min} \leq A \leq A_{max}$, and $E_{min} \leq E \leq E_{max}$, where $A_{min}$, $A_{max}$, $E_{min}$, and $E_{max}$ are preconfigured positive-valued constants.

The first set of conditions in 410 comprise $A_P \geq A/2$, $A_S>0$, $A_P+A_S=A$, $0<E_P<E$, $0<E_S \leq E$, and $E_P+E_S>E$, and they represent the normal mode for the method 400. The phrase "the first set of conditions are satisfied for a non-empty collection of the length-adapter input parameters" is intended to ensure that this mode is employed for at least one value of the length-adapter input parameters; for otherwise, there would be embodiments of the present principles in which the method 400 would in effect consist of the primary encoder step 430 only and there would be no room to employ the advantageous features of the present principles.

The condition $A_P \geq A/2$ in the first set of conditions ensures that the primary code carries at least half of the data payload and the secondary code is not permitted to take over the role of the primary code. In fact, in preferred embodiments of the present principles, more stringent conditions may be imposed, such as, $A_P \geq \max \{A/2, A-\alpha\}$, where $\alpha$ is a constant. The condition $A_S>0$ ensures that the secondary encoder is turned on and implements a non-trivial secondary code. The condition $A_P+A_S=A$ ensures that, in the splitter step 420, the data word can be split so that the primary data word and the secondary data word form a partition of the data word. The motivation here is to be able to have the primary codeword and the secondary codeword statistically independent of each other, thereby simplifying the decoding task. It is possible to extend the present principles by allowing $A_P+A_S>A$; however, we do not pursue that approach in this disclosure.

The conditions $E_P>0$ and $E_S>0$ are natural conditions for having non-trivial primary and secondary codes. The condition $E_P<E$ ensures that, in the combiner step 550, one can choose the length-adapted codeword so that a segment of length $E-E_P$ of the secondary codeword appears transparently as part of the length-adapted codeword, without interference from the primary codeword. This feature is intended to facilitate the task of estimating the secondary codeword at a receiver by providing a segment of the secondary codeword that is corrupted by channel noise but free from interference by the primary codeword. The condition $E_S \leq E$ ensures that the secondary codeword fits entirely within the length-adapted codeword.

The condition $E_P+E_S>E$ ensures that, in the combiner step 550, the length-adapted codeword can be formed so that it has a segment of length $E-E_P$ that depends only on the secondary codeword and a segment of length $E_P+E_S-E$ that depends on both the primary codeword and the secondary codeword.

The second set of conditions in 410, which comprise $A_P=A$, $A_S=0$, $E_P=E$, and $E_S=0$, represent an exceptional mode of operation for the method 400. Setting $A_S=0$ and $E_S=0$ amounts to skipping the secondary encoder step 440. Setting $A_P=A$ and $E_P=E$ amounts to relegating the length-adaptive encoding task entirely to the primary encoder step 430. In this mode, the combiner step 450 comprises setting the length-adapted codeword directly equal to the primary codeword. We note that, in some embodiments of the present principles, this exceptional mode may never be employed.

Figure 5:
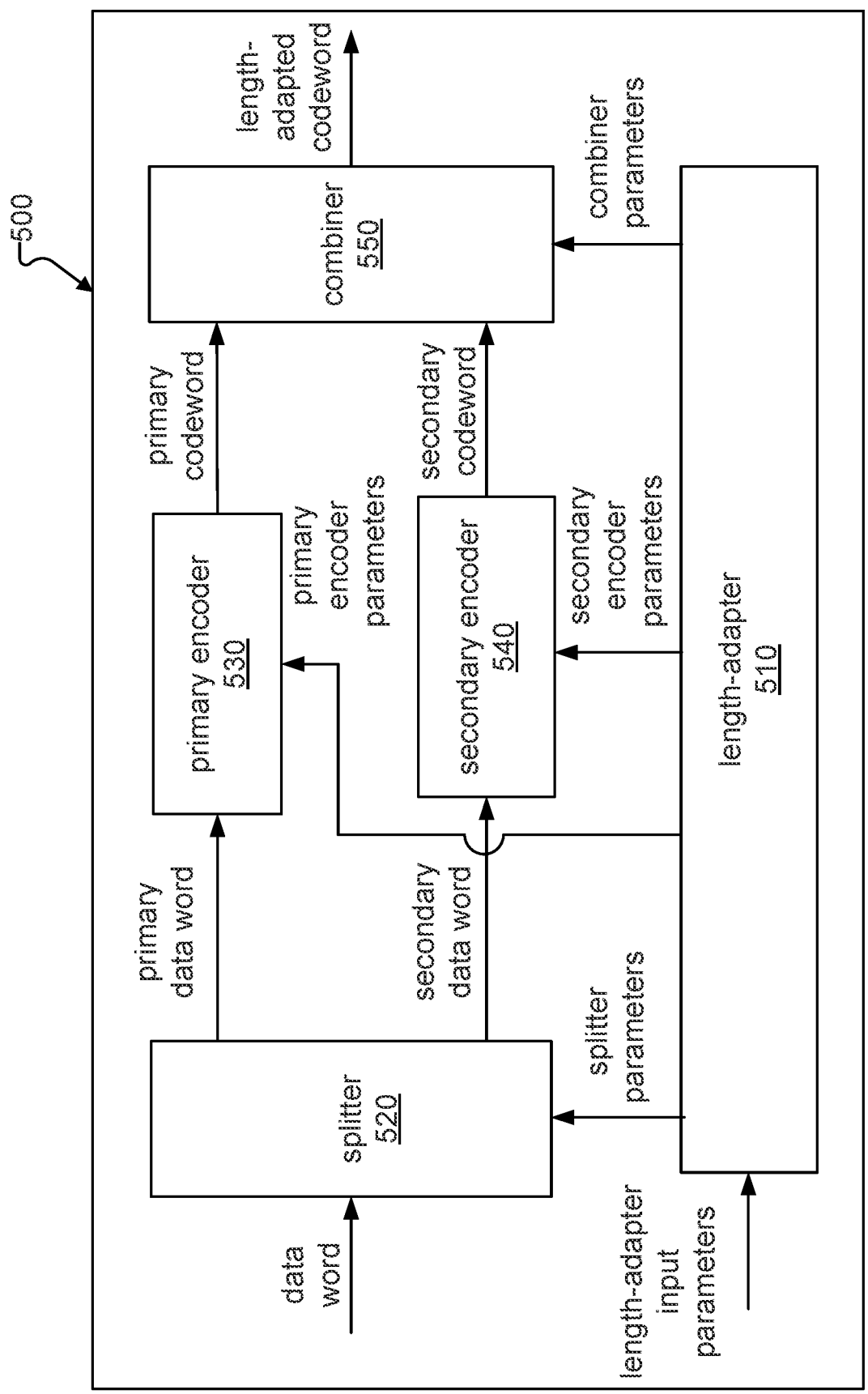
FIG. 5 is a block diagram of a length-adaptive encoding apparatus according to certain aspects of the present disclosure.

FIG. 5 is a block diagram of a length-adaptive encoding apparatus 500 configured to execute the steps of the length-adaptive encoding method 400 using programmable logic or custom-design hardware resources according to certain aspects of the present disclosure, wherein the apparatus 500 comprises a length-adapter 510, a splitter 520, a primary encoder 530, a secondary encoder 540, and a combiner 550.

The length-adapter 510 is configured to receive length-adapter input parameters and generate length-adapter output parameters, wherein the length-adapter input parameters comprise a data word length A and a length-adapted codeword length E, wherein the length-adapter output parameters comprise a primary data word length $A_P$, a secondary data word length $A_S$, a primary codeword length $E_P$, and a secondary codeword length $E_S$, wherein the data word length A and the length-adapted codeword length E are positive integers, wherein the length-adapter output parameters satisfy either a first set of the conditions or a second set of conditions, wherein the first set of conditions comprise $A_P \geq A/2$, $A_S>0$, $A_P+A_S=A$, $0<E_P<E$, $0<E_S \leq E$, and $E_P+E_S>E$, and the second set of conditions comprise A, $=A$, $A_S=0$, $E_P=E$, and $E_S=0$, wherein the first set of conditions are satisfied for a non-empty collection of the length-adapter input parameters.

The splitter 520 is configured to receive a data word and split the data word in accordance with splitter parameters into a primary data word and a secondary data word, wherein the splitter parameters comprise the primary data word length $A_P$ and the secondary data word length $A_S$.

The primary encoder 530 is configured to encode the primary data word in accordance with primary encoder parameters to generate a primary codeword, wherein the primary encoder parameters comprise the primary data word length $A_P$ and the primary codeword length $E_P$.

The secondary encoder 540 is configured to encode the secondary data word in accordance with secondary encoder parameters to generate a secondary codeword, wherein the secondary encoder parameters comprise the secondary data word length $A_S$ and the secondary codeword length $E_S$.

The combiner 550 is configured to combine the primary codeword and the secondary codeword in accordance with combiner parameters to generate a length-adapted codeword and transmit the length-adapted codeword via a channel to a decoder in the communication system, wherein the combiner parameters comprise the primary codeword length $E_P$, the secondary codeword length $E_S$, and a length-adapted codeword length E.

The constraints on the length parameters mentioned in connection the length-adapter 510 have already been discussed in connection with the length-adapter step 410 and they apply in identical manner here.

Having completed a general discussion of the present principles, we now turn to specific preferred embodiments. All preferred embodiments discussed below are subject to the same set of constraints stated in the length-adapter 410/510 even if they are not mentioned explicitly.

A first preferred embodiment of the present principles is illustrated in FIGS. 6A through 6D. In the first embodiment, the primary code and the secondary code are block codes, which may or may not be linear. The primary code and the secondary code have a common data word alphabet $\mathcal{D} = \mathbb{F}_q$ and a common codeword alphabet $\mathcal{X} = \mathbb{F}_q$, where the q can be any prime power. In the examples of the first preferred embodiment, we will consider the case where the primary and secondary codes are binary linear block codes.

Figure 6A:
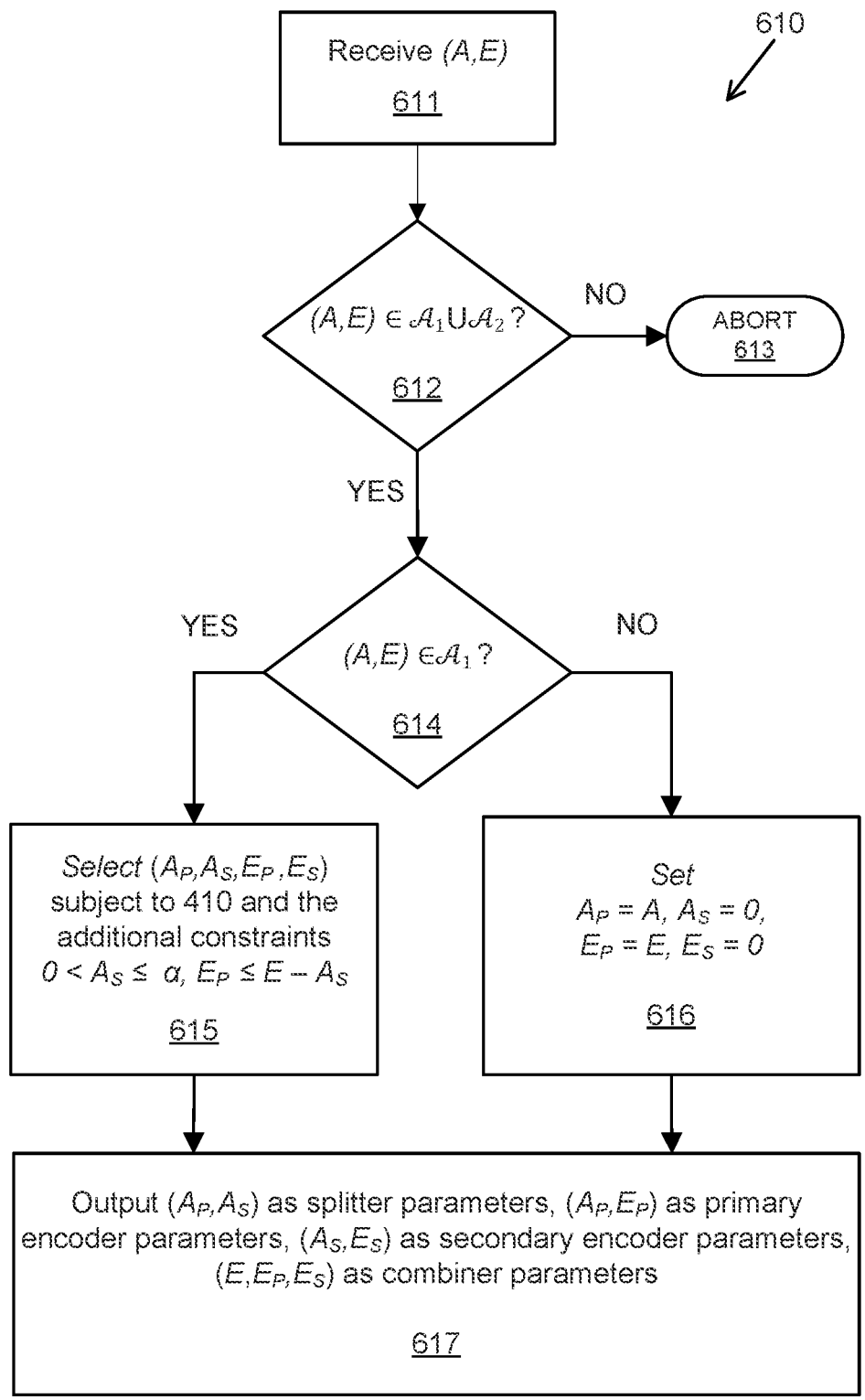
FIG. 6A is a flowchart of a length-adapter method for implementing the length-adapter step in the first preferred embodiment of the present principles.

FIG. 6A is a flowchart of a length-adapter method 610 for implementing the length-adapter step 410 in the first preferred embodiment of the present, wherein the method 610 comprises the following steps:

Step 611: Receive an input (A, E), wherein A is the data word length and E is the length-adapted codeword length.

Step 612: Check whether the input (A, E) belongs to $\mathcal{A}_1 \cup \mathcal{A}_2$, branch to step 613 if the check result is NO, and branch to step 614 if the check result is YES.

In the first preferred embodiment, the sets $\mathcal{A}_1$ and $\mathcal{A}_2$ are configured as disjoint sets and their union $\mathcal{A} \stackrel{\text{def}}{=} \mathcal{A}_1 \cup \mathcal{A}_2$ signifies the set of admissible length-adapter input parameters. The admissible set $\mathcal{A}$ is configured as the set of all inputs (A, E) that the method 610 is configured to handle. The set $\mathcal{A}_1$ comprises inputs (A, E) that lead to assigning the outputs $(A_P, A_S, E_P, E_S)$ in accordance with the first set of conditions in the length-adapter step 410 and some additional conditions. The set $\mathcal{A}_2$ comprises inputs (A, E) that lead to assigning the outputs $(A_P, A_S, E_P, E_S)$ in accordance with the second set of conditions in the length-adapter step 410.

Step 613: Abort and exit the method 610 if the step 612 fails.

Step 614: Check whether the input (A, E) belongs to $\mathcal{A}_1$, branch to step 615 if the checks result is YES, and branch to step 616 if the check result is NO.

Steps 615 and 616 comprise computing the primary data word length A, the primary codeword length $E_P$, the secondary data word length $A_S$, and the secondary codeword length $E_S$. Step 615 is executed if (A, E) belongs to $\mathcal{A}_1$ and corresponds to setting $(A_P, A_S, E_P, E_S)$ in accordance with the first set of conditions of the step 410 of method 400. Step 616 is executed if (A, E) belongs to $\mathcal{A}_2$ and corresponds to setting $(A_P, A_S, E_P, E_S)$ in accordance with the second set of conditions of the step 410 of method 400.

Step 615: Select the parameters $(A_P, A_S, E_P, E_S)$ subject to the first set of conditions in method 410 and the additional constraints $0 < A_S < \alpha$ and $E_P \leq E - A_S$, where $\alpha$ is a preconfigured positive constant.

The first additional constraint $A_S \leq \alpha$ emphasizes the auxiliary role of the secondary code. The condition $A_S \leq \alpha$ together with the conditions $A_P + A_S = A$ and $A_P \geq A/2$ implies that $A_P \geq \max\{A/2, A-\alpha\}$. This shows that the primary code is the main carrier of data, especially when A is significantly larger than $\alpha$, which is the target operating conditions for the present principles. By choosing $\alpha$ as a small constant, the first preferred embodiment ensures that the decoding complexity of the secondary code is kept under control even under exhaustive decoding procedures such as ML decoding. We will show below in an example that one can obtain significant performance improvements by choosing $\alpha$ as small as eight.

The second additional constraint $E_P \leq E - A_S$ ensures that the combiner step 410 can be arranged so that at least $A_S$ coordinates of the secondary codeword are visible transparently as part of the length-adapted codeword and they can be estimated without interference from the primary codeword at a receiver.

Step 616: Set $(A_P, E_P) = (A, E)$ and $(A_S, E_S) = (0,0)$.

Executing step 615 disables the secondary encoder 540 and passes control to the primary encoder 530 with $(A_P, E_P) = (A, E)$. Thus, the method 610 requires that the primary encoder be capable of providing length-adaptive coding for all (A, E) that belongs to $\mathcal{A}_2$. The set $\mathcal{A}_2$ may consist of inputs (A, E) where E equals a natural length for the primary code so that no length-adaptation is required. For example, if the primary code is a polar code, the set $\mathcal{A}_2$ may comprise inputs (A, E) where E is a power of two. The set $\mathcal{A}_2$ may further comprise inputs (A, E) for which activating the secondary encoder does not provide sufficient performance gains.

Step 617 comprises outputting $(A_P, A_S)$ as the splitter parameters, $(A_P, E_P)$ as the primary code parameters, $(A_P, E_P)$ as the secondary code parameters, and $(E, E_P, E_S)$ as the combiner parameters.

This completes the description of the length-adapter method 610. While the method 610 provides guidelines on how the length-adapter 410/510 may be implemented, it represents only a very specific embodiment of the present principles. The person skilled in the art will have no difficulty in finding other embodiments of the present principles based on this example.

Figure 6B:
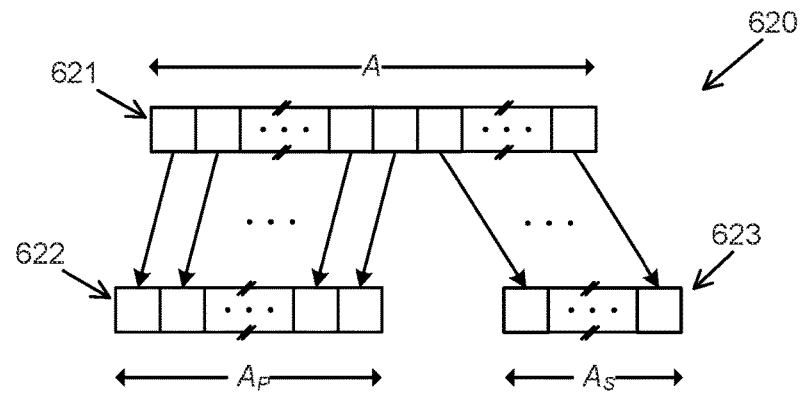
FIG. 6B is a diagram illustrating a splitter circuit for implementing, in digital logic, the splitter step in the first preferred embodiment of the present principles.

FIG. 6B is a diagram illustrating a splitter circuit 620 for implementing, in digital logic, the splitter step 420 in the first preferred embodiment of the present principles, wherein the splitter circuit 620 comprises a data word buffer 621, a primary data word buffer 622, and a secondary data word buffer 623. The buffers 621-623 are memory elements (such as random-access memory) that are capable of storing digital data. The inputs to the circuit 620 are the data word $d = (d_0, \ldots, d_{A-1})$ and the splitter parameters $(A_P, A_S)$. The data word d is initially stored in the data word buffer 621. In a next step, the circuit 620 moves the first $A_P$ entries of the data word buffer 621 to the primary data word buffer 622 and the remaining $A_S$ entries of the data word buffer 621 to the secondary data word buffer 623, as shown in FIG. 6B. After the move, the primary data word buffer 622 contains the primary data word $d^{(P)} = (d_0^{(P)}, \ldots, d_{A_P-1}^{(P)})$ and the secondary data word buffer 623 contains the secondary data word $d^{(S)} = (d_0^{(S)}, \ldots, d_{A_S-1}^{(S)})$. Thus, the circuit 620 in effect carries out the assignment operations $d^{(P)} = d_T$ and $d^{(S)} = d_{T^c}$ where $T = \{0, 1, \ldots, A_P-1\}$ and $T^c = \{A_P, A_P+1, \ldots, A\}$.

In the first preferred embodiment, the primary encoder 530 receives the primary encoder parameters $(A_P, E_P)$ from the length-adapter 510, receives the primary data word $d^{(P)}$ of length $A_P$ from the splitter 520, and encodes the primary data word $d^{(P)}$ into a primary codeword $x^{(P)}=(x_0^{(P)}, \ldots, x_{E_P-1}^{(P)})$ of length $E_P$. Likewise, in the first preferred embodiment, the secondary encoder 540 receives the secondary code parameters $(A_S, E_S)$ from the length-adapter 510 and receives the secondary data word $d^{(S)}$ of length $A_S$ from the splitter 520, and encodes the secondary data word $d^{(S)}$ into a secondary codeword $x^{(S)}$ $(x_0^{(S)}, \ldots, x_{E_S-1}^{(S)})$ of length $E_S$.

The secondary code may be a polar code. If a polar code is used as the secondary code, a preferred value for the secondary codeword length $E_S$ is the size of the polar transform that defines the polar code.

Alternatively, the secondary code may be a general linear code optimized for the specific application at hand. If a general linear block codes is employed as the secondary code, a preferred method of implementation is to choose a mother generator matrix $G_{S,max}$ with $A_{S,max}$ rows and $E_{S,max}$ columns, where $A_{S,max}$ and $E_{S,max}$ are the maximum possible values of $A_S$ and $E_S$ that may be assigned by the length-adapter 520 to the secondary encoder 540. Then, for any given assignment $(A_S, E_S)$, the secondary encoder 540 computes the secondary codeword as $x^{(S)}=d^{(S)}G_S$, where $G_S$ is the submatrix of $G_{S,max}$, comprising the first $A_S$ rows and the first $E_S$ columns of $G_{S,max}$. The mother generator matrix $G_{S,max}$ may be chosen by trial-and-error until satisfactory performance is obtained.

Figure 6C:
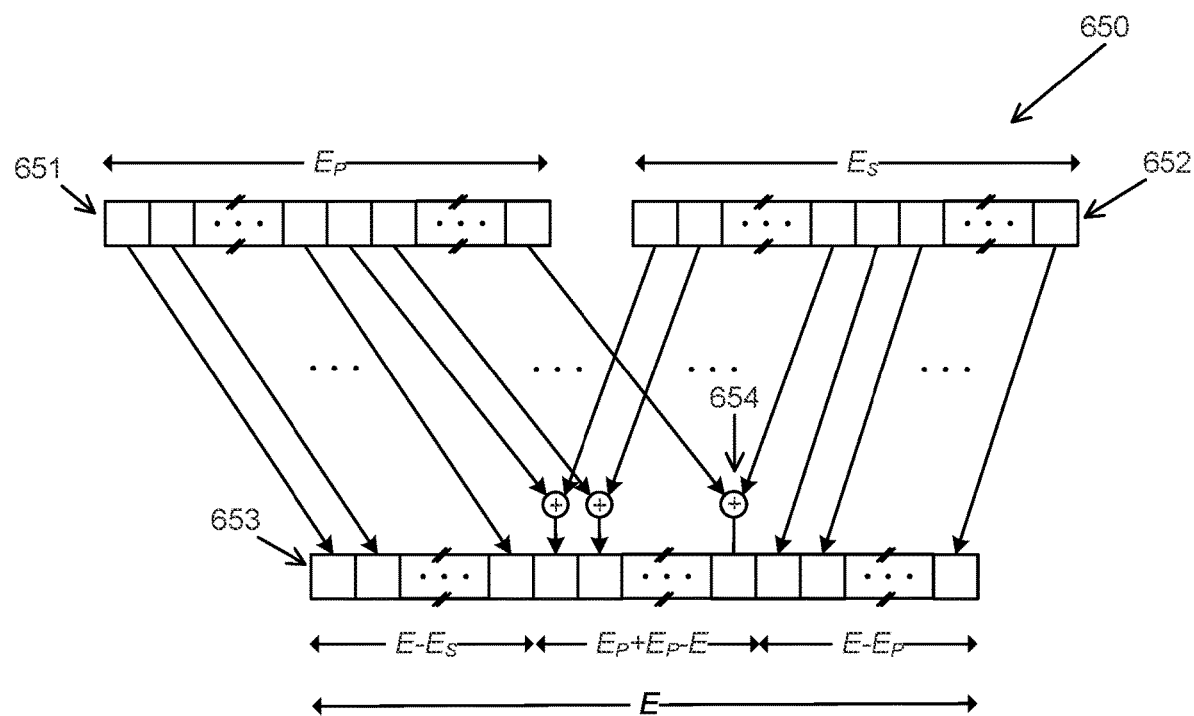
FIG. 6C is a diagram illustrating a combiner circuit for implementing, in digital logic, the combiner step in the first preferred embodiment of the present principles.

FIG. 6C is a diagram illustrating a combiner circuit 650 for implementing, in digital logic, the combiner step 450 in the first preferred embodiment of the present principle, wherein the circuit 650 comprises a primary codeword buffer 651, a secondary codeword buffer 652, a length-adapted codeword buffer 653, and circuit elements, such as 654, for implementing addition of vector elements. The circuit 650 begins operations with the primary codeword $x^{(P)}$ stored in the primary codeword buffer 651, the secondary codeword $x^{(S)}$ stored in the secondary codeword buffer 652. In effect, the circuit 650 is designed to obtain the length-adapted codeword $x^{(C)}=(x_0^{(C)}, \ldots, x_{E-1}^{(C)})$ by implementing the formula $x^{(C)}=(x^{(P)}, 0_P) \otimes (0_S, x^{(S)})$ in digital logic, where $0_P$ is an all-zero vector of length $E-E_P$, $0_S$ is an all-zero vector of length $E-E_S$, and $\otimes$ denotes addition of vectors. An instance of the $\otimes$ operation is shown by the circuit element 654. At the end of the computation, the buffer 653 holds the length-adapted codeword $x^{(C)}$. The length-adapted codeword $x^{(C)}$ comprises three segments: a primary-only segment $(x_0^{(C)}, \ldots, x_{E-E_S-1}^{(C)})$ Corresponding to the Entries in the Leftmost $E-E_S$ positions of the buffer 653, a jointly encoded segment $(x_{E-E_S}^{(C)}, \ldots, x_{E_P-1}^{(C)})$ corresponding to the entries in the next $E_P+E_S-E$ positions of the buffer 653, and a secondary only segment $(x_{E_P+1}^{(C)}, \ldots, x_{E-1}(C))$ corresponding to the entries in the rightmost $E-E_P$ positions of the buffer 653. The primary-only segment contains a transparent copy of a segment of the primary codeword and the secondary-only segment contains a transparent copy of the secondary codeword. By having primary-only and secondary-only segments, the present principles aim to simplify decoding tasks at the receiver side in the system 300. By having a jointly-encoded segment, the present principles aim to improve performance.

The present principles admit the possibility of having an empty primary-only segment; however, they require the secondary-only segment to be non-empty whenever the input parameters $(A, E)$ belong to $\mathcal{A}_1$ and the first set of conditions are in effect.

Although not shown in FIG. 6C, the combiner circuit 650 may optionally comprise interleaving operations, wherein the interleaving operations permute coordinates of the primary codeword or the secondary codeword or both. For example, the secondary codeword may be interleaved before being written into the buffer 652. Interleaving influences the distance properties of the length-adapted code and can improve performance. Interleaving is recommended especially w % ben the primary code and the secondary code are of the same type and there is need for decorrelating the primary and secondary codewords.

This completes the description of the first preferred embodiment. Next, we analyze the performance that can be achieved by the first preferred embodiment when the secondary code is chosen at random from an ensemble of linear block codes.

Theorem. Consider the first preferred embodiment of the present principles as described above in connection with FIGS. 6A, 6B, and 6C with input length parameters $(A, E)$ that belong to $\mathcal{A}_1$. Let $\mathcal{C}_P=\mathcal{C}_P(A_P, E_P)$ be the primary code and $\mathcal{C}_S=\mathcal{C}_S(A_S, E_S)$ be the secondary code corresponding to the input $(A, E)$. Suppose the primary code $\mathcal{C}_P$ is a fixed binary linear block code with a weight enumerator $W_P(D)=W_P(A_P, E_P, D)$. Suppose the secondary code $\mathcal{C}_S$ is chosen uniformly at random from the set of all possible binary linear block codes with parameters $(A_S, E_S)$. Let $\mathcal{C}_C=\mathcal{C}_C(A, E)$ denote the resulting length-adapted code, with codewords of the form $x^{(C)}=(x^{(P)}, 0_P) \oplus (0_S, x^{(S)})$ where $x^{(P)}$ and $x^{(S)}$ are codewords that belong to the primary and the secondary codes, respectively, and where $\oplus$ denotes addition modulo-2. Suppose the length-adapted codeword $x^{(C)}$ is sent over a binary-input memoryless channel and let $\overline{P}_e=\overline{P}_e(A, E)$ denote the probability of block error for $\mathcal{C}_C$ under ML decoding, averaged over all possible choices for the secondary code $\mathcal{C}_S$. Then, we have the upper bound $\overline{P}_e \leq (M_S-1)M_P 2^{-(E_P+E_S-E)R_o}+W_P(Z)-1$, where $M_P=2^{A_P}$ is the number of codewords in the primary code, $M_S=2^{A_S}$ is the number of codewords in the secondary code, $R_0$ is the cutoff rate of the channel, Z is the Bhattacharyya parameter of the channel, and $W_P(Z)$ is the weight enumerator of the primary code $\mathcal{C}_P$ evaluated at D=Z.

Proof. We use a standard random-coding argument for the proof. Suppose that a length-adapted codeword $x^{(C)}=(x^{(P)}, 0_P) \oplus (0_S, x^{(S)})$ corresponding to a pair of primary and secondary data words $d^{(P)}$, $d^{(S)}$ is sent over the channel and a received word $y^{(C)}$ is received at the channel output. Let us say that a type-1 error occurs if there exists a length-adapted codeword $\tilde{x}^{(C)}=(\tilde{x}^{(P)}, 0_P) \oplus (0_S, x^{(S)})$ corresponding to an erroneous data word $(\tilde{d}^{(P)}, d^{(S)})$ with $\tilde{d}^{(P)} \neq d^{(P)}$ such that $P(y^{(C)}|\tilde{x}(C)) \geq P(y^{(C)}|x^{(C)})$, where $P(y^{(C)}|\tilde{x}^{(C)})$ and $P(y^{(C)}|x^{(C)})$ are the conditional probabilities of receiving $y^{(C)}$ given that $\tilde{x}^{(C)}$ and $x^{(C)}$ are sent, respectively. Let us say that a type-2 error occurs if there exists a length-adapted codeword $\tilde{x}^{(C)}=(\tilde{x}^{(P)}, 0_P) \oplus (0_S, \tilde{x}^{(S)})$ corresponding to an erroneous data word $(\tilde{d}^{(P)}, \tilde{d}^{(S)})$ with $\tilde{d}^{(S)} \neq d^{(S)}$ (in this case $\tilde{d}^{(P)}$ may or may not be equal to the correct primary data word $\tilde{d}^{(P)}$) such that $P(y^{(C)}|\tilde{x}^{(C)})) \geq P(y^{(C)}|x^{(C)})$. Let $\overline{P}_{e,1}=\overline{P}_{e,1}(A, E)$ and $\overline{P}_{e,2}=\overline{P}_{e,2}(A, E)$ denote, respectively, the probabilities of type-1 and type-2 error, averaged over all possible choices for the secondary coded $\mathcal{C}_S$. Clearly, we have $\overline{P}_e \leq \overline{P}_{e,1}+\overline{P}_{e,2}$. Since the secondary code has no effect on type-1 error probability, we have $\overline{P}_{e,1} \leq W_P(Z)-1$. As for type-2 errors, observe that any two codewords in the length-adapted code that correspond to different secondary data words are pairwise-independent over the jointly-encoded segment $(x_{E-E_S}^{(C)}, \ldots, x_{E_P-1}^{(C)})$. Hence, a suboptimal decoder that ignores the portion of the received word $y^{(C)}$ outside the jointly-encoded segment $(y_{E-E_S}^{(C)}, \ldots, y_{E_P-1}^{(C)})$ can still achieve a type-2 pairwise error probability bounded by $2^{-(E_P+E_S-E)R_0}$ (averaged over all secondary codes in the ensemble), where the term $E_P+E_S-E$ in the exponent corresponds to the length of the jointly-encoded segment. Since there are $(M_S-1)M_P$ codewords in the length-adapted code that can cause a type-2 error, the type-2 error probability for the suboptimal decoder is bounded by $(M_S-1)M_P 2^{-(E_P+E_S-E)R_0}$. Since any upper bound on the type-2 error probability for the suboptimal decoder is also an upper bound on the type-2 error probability for an ML decoder, the proof is complete.

We observe that the bound $(M_S-1)M_P 2^{-(E_P+E_S-E)R_0}$ decreases exponentially in the length of the jointly-encoded segment $E_P+E_S-E$. It is preferable to have $E_P+E_S-E$ large enough so that the bound $(M_S-1)M_P 2^{-(E_P+E_S-E)R_0}$ on type-2 error probability is significantly smaller than the bound $W_P(Z)-1$ on the type-1 error probability. Then, $\overline{P}_e$ is essentially upper-bounded by $W_P(Z)-1$, which is the union bound on the performance of the primary code $\mathcal{C}_P$. In that case, it makes sense to compare the union bound $W_P(A_P, E_P, Z)-1$ with the union bound $W_P(A, E, Z)-1$ of a benchmark system in which the length-adapter always sets $(A_P, E_P)=(A, E)$, in effect permanently disabling the secondary encoder. The present principles provide an improvement over the benchmark system only if $W_P(A_P,E_P,Z)<W_P(A, E, Z)$. In fact, we should have $W_P(A_P, E_P, Z)$ significantly smaller than $W_P(A, E, Z)$ to justify the additional complexity of using the present principles. We now turn to an example that shows that the present principles can provide the type of improvement that the theorem predicts.

Figure 6D:
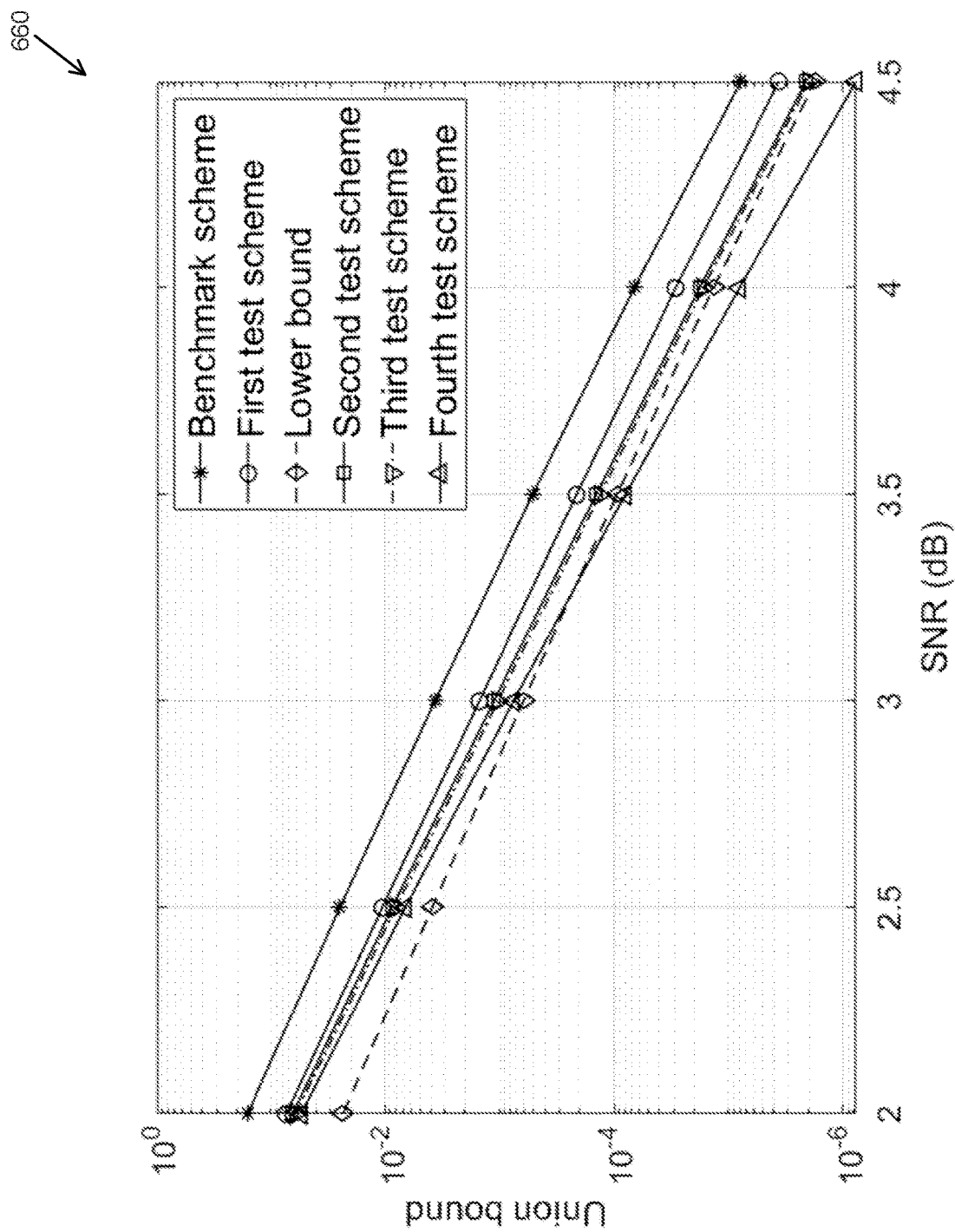
FIG. 6D is a chart illustrating the performance advantages of the first embodiment of the present principles in an example comprising a benchmark scheme and four test schemes.

FIG. 6D is a chart 660 illustrating the performance advantages of the first embodiment of the present principles in an example comprising a benchmark scheme and four test schemes. The benchmark scheme employs a 5G NR Physical Uplink Control Channel (PUCCH) polar encoder in a stand-alone model. For brevity, in the following, we will refer to "5G NR PUCCH polar encoder" as "5G polar encoder". Details of the 5G polar encoder can be found in the document 3GPP TS 38.212 V.16.4.0 (2020-12). The four test schemes are all instances of the first preferred embodiment of the present principles. They employ the 5G polar encoder as the primary encoder but differ from each other in details. In the example, we compare the benchmark scheme and the test schemes using their weight enumerators and union bounds on a BI-AWGN channel model.

In the example, the test schemes follow the length-adapter method 610 with $\alpha=8$ and an admissible set $\mathcal{A}=\{(A, E): 12 \le A \le 1706, 18 \le E \le 16384\}$ (which is the admissible set for the 5G polar encoder). The benchmark scheme and the test schemes operate on a common input $(A, E)=(29,72)$, which belongs to $\mathcal{A}$.

Benchmark scheme. The benchmark scheme is a stand-alone 5G polar encoder. On input $(A, E)=(29,72)$, the 5G polar encoder uses a polar code of size $N=64$ followed by length-adaptation by repetition. Details of encoding are best illustrated by an example. Suppose that the data word equals d=(0, 0, 1, 1, 1, 0, 1, 0, 1, 0, 1, 0, 0, 1, 1, 0, 1, 1, 0, 0, 0, 0, 1, 1, 1, 1, 1, 0, 1). The 5G polar encoder computes the CRC (using the CRC polynomial $D^{11}+D^{10}+D^9+D^5+1$) as p=(0, 0, 0, 0, 0, 1, 1, 1, 0, 1, 0), appends the CRC to the data word to obtain c=(d,p)=(0, 0, 1, 1, 1, 0, 1, 0, 1, 0, 1, 0, 0, 1, 1, 0, 1, 1, 0, 0, 0, 0, 1, 1, 1, 1, 1, 0, 1, 0, 0, 0, 0, 0, 1, 1, 1, 0, 1, 0), obtains the polar transform input u=(0, 0, 0, 0, 0, 0, 0, 0, 0, 0, 0, 0, 0, 0, 1, 0, 0, 0, 0, 0, 1, 1, 0, 0, 0, 1, 0, 1, 0, 1, 0, 0, 0, 0, 1, 0, 1, 0, 1, 0, 1, 0, 0, 0, 0, 0, 1, 1, 1, 1, 1, 0, 1, 0, 0, 0, 0, 1, 1, 1, 1, 0, 1, 0) by setting $u_Q=c$ and $u_{Q^c}=0$ where Q={13, 14, 15, 21, 22, 23, 25, 26, 27, 28, 29, 30, 31, 35, 37, 38, 39, 41, 42, 43, 44, 45, 46, 47, 48, 49, 50, 51, 52, 53, 54, 55, 56, 57, 58, 59, 60, 61, 62, 63} is a polarization index set chosen in accordance with the 5G polar code design rule, calculates the polar transform of u to obtain a polar transform output v=(0, 0, 1, 0, 1, 0, 0, 0, 1, 1, 1, 1, 0, 0, 1, 0, 0, 1, 0, 0, 0, 0, 0, 0, 0, 1, 0, 0, 0, 1, 1, 1, 0, 0, 1, 0, 0, 1, 1, 0, 0, 1, 1, 1, 0, 0, 1, 1, 1, 0, 0, 0, 0, 1, 1, 1, 0, 0, 1, 1, 1, 0, 0, 1, 0, 0, 0, 1, 1, 1, 1, 0, 0, 1, 1), applies a subblock interleaving operation to v to obtain w=(0, 0, 1, 0, 1, 0, 1, 1, 0, 1, 1, 0, 1, 0, 0, 0, 1, 0, 0, 0, 0, 0, 0, 0, 1, 1, 0, 0, 0, 0, 1, 0, 1, 1, 0, 0, 0, 1, 1, 0, 1, 1, 1, 0, 0, 0, 1, 0, 1, 1, 1, 0, 1, 1, 1, 1, 0, 0, 1, 1, 0, 0, 1, 1, 0, 0, 1, 1, 0, 0, 0, 1, 1, 0, 1, 0, 1, 1, 0, 1, 1, 0, 0, 1, 1, 0), and applies length-adaptation to w by repeating the first 8 bits of w to obtain the length-adapted codeword x=(0, 0, 1, 0, 1, 0, 1, 1, 0, 1, 1, 0, 1, 0, 0, 1, 0, 0, 1, 0, 0, 0, 0, 0, 0, 0, 1, 1, 0, 0, 0, 0, 1, 0, 1, 1, 0, 0, 0, 1, 0, 1, 1, 1, 0, 1, 1, 1, 0, 1, 1, 0, 0, 0, 1, 1, 0, 0, 1, 1, 0, 1, 1, 0, 1, 1, 0, 0, 1, 0, 0, 0, 1, 0, 1, 0, 1, 1, 1). We observe that the Hamming weight of the length-adapted codeword in this instance is 32. By computing the Hamming weights of all $2^{A=29}$ length-adapted codewords in like manner, we obtain the weight enumerator of the 5G NR PUCCH polar code corresponding to length-adapter input parameters (A, E)=(29,72) as $W_{5G}(D)=1+2D^{11}+63D^{12}+127D^{13}+437D^{14}+992D^{15}+3426D^{16}+8210D^{17}+21585D^{18}+50929D^{19}+115080D^{20}+250540D^{21}+495316D^{22}+952729D^{23}+1702475D^{24}+2913925D^{25}+4765807D^{26}+7316148D^{27}+10799124D^{28}+15133678D^{29}+20294122D^{30}+26075236D^{31}+31759791D^{32}+37136391D^{33}+41496809D^{34}+44377193D^{35}+45532191D^{36}+44378647D^{37}+41493255D^{38}+37141933D^{39}+31749557D^{40}+26074265D^{41}+20302913D^{42}+15127413D^{43}+10801610D^{44}+7318990D^{45}+4764940D^{46}+2916071D^{47}+1701023D^{48}+950779D^{49}+494882D^{50}+250938D^{51}+115405D^{52}+51137D^{53}+21689D^{54}+8014D^{55}+3468D^{56}+1038D^{57}+436D^{58}+129D^{59}+47D^{60}+D^{61}+D^{62}+D^{63}+3D^{64}$.

By looking at the minimum-distance term $2D^{11}$ in the weight enumerator $W_{5G}(D)$, we see that the length-adapted code in the benchmark scheme has minimum distance 11 with multiplicity 2. As pointed out above, the minimum-distance term is significant as it determines the asymptotic behavior of the union bound. FIG. 6D shows the union bound $W_{5G}(D=Z=e^{-SNR/2})-1$ for the benchmark scheme on a BI-AWGN channel as the signal-to-noise ratio SNRdB$\underset{=}{def}$ 10 $\log_{10}$ SNR ranges from 2 to 4.5 decibels (dB).

First test scheme. In the first test scheme, the primary encoder 530 is a 5G polar encoder and the secondary encoder 540 is a basic polar encoder (with no CRC and no interleaving). We suppose that, in response to the input (A, E)=(29,72), the first test scheme sets $(A_P, E_P)=(24,64)$ and $(A_S, E_S)=(5,64)$. (Note that by specifying the primary and secondary code lengths as powers of two, the first test scheme avoids the need to apply any further length-adaptation at the primary and secondary encoders. In general, whenever the secondary code is a polar code, it is preferable to choose the secondary code length $E_S$ equal to the largest power of two that is smaller than or equal to the length-adapted code length E.)

The primary encoder 530 in the first test scheme follows the 5G polar encoder procedures with input $(A_P, E_P)=(24, 64)$. With the addition of an 11-bit CRC, the primary code uses a polarization index set $Q_{P,1}=\{15, 22, 23, 25, 26, 27, 28, 29, 30, 31, 37, 38, 39, 41, 42, 43, 44, 45, 46, 47, 49, 50, 51, 52, 53, 54, 55, 56, 57, 58, 59, 60, 61, 62, 63\}$ of size. (The 5G encoder does not apply any length adaptation here since the block length 64 is a power of two.) The secondary encoder uses a polarization index set $Q_{S,1}=\{55, 59,61,62, 63\}$, which is chosen in accordance with the 5G polar code design rule. The weight enumerators of the resulting codes are computed as $W_{P,1}(D)=1+27D^{12}+110D^{14}+955D^{16}+5532D^{18}+39648D^{20}+128379D^{22}+515951D^{24}+956647D^{26}+$ $2281749D^{28}+2579835D^{30}+3760898D^{32}+2578291D^{34}+2280787D^{36}+957265D^{38}+516781D^{40}+128357D^{42}+39364D^{44}+5515D^{46}+998D^{48}+101D^{50}+25D^{52}$ for the primary code, $W_{S,1}(D)=1+30D^{32}+D^{64}$ for the secondary code, and $W_{C,1}(D)=1+53D^{12}+242D^{14}+2230D^{16}+13662D^{18}+104238D^{20}+437880D^{22}+2031256D^{24}+6023289D^{26}+17412806D^{28}+36088908D^{30}+65377330D^{32}+89870472D^{34}+102024160D^{36}+90326024D^{38}+64643288D^{40}+36793926D^{42}+16927669D^{44}+6294450D^{46}+1911046D^{48}+473378D^{50}+96442D^{52}+15888D^{54}+2080D^{56}+185D^{58}+8D^{60}+D^{64}$ for the length-adapted code.

We observe that the minimum-distance term in $W_{C,1}(D)$ is $53D^{12}$, which indicates that the length-adapted code in the first test scheme has minimum distance 12 with multiplicity 53. We may compare the length-adapted codes in the benchmark scheme and first test scheme based on the minimum-distance terms in their weight enumerators, namely, in terms of $2D^{11}$ and $53D^{12}$, respectively. This comparison indicates that first test scheme has an advantage over the benchmark scheme in terms of minimum distance (12 vs 11), although the opposite is true about the multiplicity of the minimum-distance codewords (53 vs 2). The effect of the multiplicities vanishes asymptotically, and we anticipate that the first test scheme will have a better union bound compared to the benchmark scheme at sufficiently high SNR values.

FIG. 6D shows the union bound $W_{C,1}(e^{-SNR/2})-1$ for the first test scheme. We observe that the first test scheme provides a significant performance gain over the benchmark scheme even at low to moderate SNR values (despite the disadvantage in terms of multiplicity of minimum-distance codewords). The performance gain is explained by the improvement of the code minimum distance from 11 to 12.

Also shown in FIG. 6D is the union bound for the primary code $W_{P,1}(e^{-sNR/2})-1$ (the dashed line). The union bound for the primary code serves as a lower bound to the union bound for the length-adapted code since the primary code is a subcode of the length-adapted code in the first preferred embodiment of the present principles due to the way the combiner is defined. The minimum-distance term of the primary code is $27D^{12}$, which differs from the minimum-distance term $53D^{12}$ of the length-adapted code by a scalar factor; so, for the given primary code, the first test scheme has already reached the best possible minimum distance for the length-adapted code. There may still be room for improving the multiplicity of the minimum-distance codewords in the length-adapted code by altering the secondary code design; but any such improvement is limited by a factor of 53/27.

Second test scheme. The second test scheme differs from the first test scheme only by the inclusion of an 11-bit CRC as part of the secondary code. The second test scheme follows the method 610 with a=8 and sets $(A_P, E_P)=(24,64)$ and $(A_S, E_S)=(5,64)$. Now, the secondary code is a polar code with an 11-bit CRC and a polarization index set $Q_{S,2}=\{30, 31, 45, 46, 47, 51, 53, 54, 55, 57, 58, 59, 60, 61, 62, 63\}$ of size 16, where $Q_{S,2}$ is chosen in accordance with the 5G polar code design rule. The weight enumerator $W_{P,2}(D)$ for the primary code is the same as $W_{P,1}(D)$ in the first test scheme. The weight enumerator for the secondary code is $W_{S,2}(D)=1+D^{24}+D^{28}+22D^{32}+3D^{36}+4D^{40}$ and the weight enumerator of the length-adapted code is $W_{C,2}(D)=1+28D^{12}+148D^{14}+1542D^{16}+11654D^{18}+89961D^{20}+436596D^{22}+1970614D^{24}+6265776D^{26}+17438220D^{28}+36736168D^{30}+64821313D^{32}+89482324D^{34}+100990142D^{36}+90477864D^{38}+65278328D^{40}+37434216D^{42}+17096048D^{44}+6155908D^{46}+1733776D^{48}+378326D^{50}+63297D^{52}+7844D^{54}+762D^{56}+56D^{58}$.

The minimum-distance term in $W_{C,2}(D)$ is now $28D^{12}$, which is very close to the minimum-distance term $27D^{12}$ in $W_{P,2}(D)$. Turning to FIG. 6D, we see that the union bound $W_{C,2}(e^{-SNR/2})-1$ for the second test scheme improves the union bound of the first test scheme and closes the gap to the lower bound $W_{P,2}(e^{-sNR/2})-1$ to a large extent at high SNR. The superior performance of the second test scheme compared to the first test scheme can be attributed to the improved distance profile of the secondary code by the inclusion of a CRC in the polar code construction.

Third test scheme. The third test scheme differs from the first and second test schemes only in the secondary code, which is no longer a polar code. The third test scheme follows the method 610 with a=8 and sets $(A_P, E_P)=(24,64)$ and $(A_S, E_S)=(5,72)$. Note that $E_S=72$ is the largest possible length for the secondary code under the constraint $E_S \leq E$. The primary encoder is a polar encoder as in the first two test schemes. The secondary encoder implements a linear code with a generator matrix $G_S$ that has a first row (1, 1, 1, 0, 0, 0, 0, 1, 1, 0, 1, 0, 1, 1, 0, 1, 0, 1, 0, 0, 0, 0, 1, 1, 0, 0, 0, 1, 0, 0, 0, 0, 1, 0, 0, 1, 0, 0, 0, 1, 0, 1, 0, 0, 0, 1, 1, 0, 0, 1, 0, 1, 1, 1, 0, 0, 1, 1, 1, 0, 1, 1, 1, 0, 0, 0, 0, 0, 1, 0, 1, 1), a second row (0, 0, 0, 1, 0, 0, 0, 0, 1, 1, 1, 0, 0, 1, 1, 0, 1, 1, 0, 1, 1, 0, 1, 0, 1, 0, 1, 1, 1, 1, 0, 1, 0, 0, 0, 0, 1, 0, 0, 0, 1, 0, 1, 0, 0, 0, 1, 0, 1, 0, 0, 0, 1, 1, 1, 0, 0, 0, 1, 1, 0, 0, 0, 0, 0, 1, 1, 1, 0, 0, 0, 1, 1), a third row (0, 1, 0, 0, 0, 0, 0, 1, 1, 1, 0, 1, 1, 1, 0, 1, 0, 1, 0, 1, 0, 1, 0, 0, 1, 1, 0, 1, 0, 0, 1, 1, 0, 1, 0, 1, 0, 1, 1, 1, 0, 0, 0, 0, 1, 1, 0, 0, 0, 0, 1, 1, 1, 0, 1, 1, 0, 1, 0, 0, 1, 0, 1, 1, 0, 1, 1, 1, 0, 1, 1, 1), a fourth row (1, 1, 0, 0, 1, 0, 1, 0, 0, 0, 1, 0, 0, 1, 1, 1, 1, 1, 1, 0, 1, 1, 0, 1, 1, 0, 0, 0, 0, 1, 1, 0, 0, 1, 1, 0, 1, 1, 0, 1, 0, 0, 1, 0, 0, 1, 0, 1, 0, 0, 0, 0, 0, 1, 0, 1, 1, 1, 0, 1, 1, 1, 1, 0, 1, 0), and a fifth row (1, 0, 0, 0, 0, 0, 1, 1, 0, 0, 1, 1, 0, 0, 0, 0, 0, 1, 0, 0, 1, 0, 1, 1, 1, 0, 0, 0, 0, 1, 1, 0, 1, 0, 1, 1, 0, 0, 1, 0, 1, 0, 0, 0, 0, 0, 0, 0, 1, 1, 1, 1, 1, 0, 1, 1, 1, 0, 0, 0, 0, 0, 1, 0, 1, 1, 0, 0, 0, 0). (This generator matrix was found by search until superior performance was obtained relative to the second test scheme.) The primary code weight enumerator $W_{P,3}(D)$ in the third test scheme is the same as the primary code weight enumerators in the first and second test schemes. The secondary code weight enumerator is obtained as $W_{S,3}(D)=1+D^{26}+D^{29}+D^{31}+2D^{32}+4D^{33}+3D^{34}+3D^{35}+2D^{36}+3D^{37}+5D^{38}+2D^{39}+1D^{40}+2D^{41}+D^{42}$, and the length-adapted code weight enumerator as $W_{C,3}(D)=1+27D^{12}+2D^{13}+120D^{14}+55D^{15}+1130D^{16}+887D_{17}+7556D^{18}+8903D^{19}+57377D^{20}+66092D^{21}+247343D^{22}+365620D^{23}+1115604D^{24}+1538542D^{25}+3257422D^{26}+5010706D^{27}+9111274D^{28}+12714805D^{29}+18390884D^{30}+25318242D^{31}+32561593D^{32}+39833498D^{33}+44142280D^{34}+49750474D^{35}+49997626D^{36}+49496468D^{37}+44682794D^{38}+39331724D^{39}+32575012D^{40}+24990952D^{41}+18927452D^{42}+12688480D^{43}+8838407D^{44}+5140672D^{45}+3284716D^{46}+1657631D^{47}+967716D^{48}+422551D^{49}+223076D^{50}+84215D^{51}+39957D^{52}+13128D^{53}+5471D^{54}+1672D^{55}+576D^{56}+130D^{57}+38D^{58}+6D^{59}+4D^{60}+D^{61}$.

The minimum-distance term in $W_{C,3}(D)$ is now $27D^{12}$, which coincides with the minimum-distance term in $W_{P,3}(D)$. This assures that, as the SNR increases, the third test scheme saturates the available performance gains. FIG. 6D shows that the union bound $W_{C,3}(e^{-SNR/2})-1$ for the third test scheme improves the union bound for the second test scheme only very slightly. We may conclude that the second test scheme, based on a polar code with CRC, provides near-optimal performance at low-complexity. The gains by the third test scheme are not significant enough to justify the additional complexity it brings. If one desires further gains over the second test scheme, it is advisable to lighten the data payload of the primary code further.

Fourth test scheme. The fourth test scheme achieves further performance gains by allocating $A_S=8$ bits to the secondary code, unlike the previous test schemes which allocated $A_S=5$ bits. Note that $A_S=8$ is the maximum number of bits that can be assigned to the secondary encoder under the constraint $A_S \leq \alpha$ with $\alpha=8$. In the fourth test scheme, the primary encoder is a 5G polar encoder with $(A_P, E_P)=(21, 64)$ and the secondary encoder is a polar encoder with $(A_S, E_S)=(8,64)$. The primary encoder uses a polarization index set $Q_{P,4}=\{15, 22, 23, 27, 28, 29, 30, 31, 38, 39, 41, 42, 43, 44, 45, 46, 47, 49, 50, 51, 52, 53, 54, 55, 56, 57, 58, 59, 60, 61, 62, 63\}$ of size 32 (chosen in accordance with 5G polar encoder specification). The secondary code is a polar code with an 11-bit CRC and a polarization index set $Q_{S,4}=\{29, 30, 31, 39, 43, 45, 46, 47, 51, 53, 54, 55, 57, 58, 59, 60, 61, 62, 63\}$ of size 19 (chosen in accordance with 5G polar encoder specification). The weight enumerators are calculated as $W_{P,4}(D)=1+6D^{12}+2D^{14}+182D^{16}+367D^{18}+6479D^{20}+9272D^{22}+86311D^{24}+68234D^{26}+379621D^{28}+184392D^{30}+627908D^{32}+183940D^{34}+379015D^{36}+68544D^{38}+86805D^{40}+9150D^{42}+6329D^{44}+382D^{46}+201D^{48}+5D^{50}+6D^{52}$ for the primary code, $W_{S,4}(D)=1+23D^{24}+30D^{28}+135D^{32}+50D^{36}+17D^{40}$ for the secondary code, and $W_{C,4}(D)=1+7D^{12}+51D^{14}+1063D^{16}+8924D^{18}+72590D^{20}+398241D^{22}+1838439D^{24}+6206759D^{26}+17298991D^{28}+37177778D^{30}+65064175D^{32}+89977912D^{34}+100747848D^{36}+90098102D^{38}+64877614D^{40}+37351862D^{42}+17178633D^{44}+6275835D^{46}+1808433D^{48}+406084D^{50}+71018D^{52}+9545D^{54}+931D^{56}+75D^{58}+D^{60}$ for the length-adapted code.

We observe that the minimum-distance term in the weight enumerator of the length-adapted code in the fourth test scheme is $7D^{12}$. Although the minimum distance (12) is the same as the ones in the first three test schemes, the multiplicity (7) is significantly better. As expected, FIG. 6D shows that the union bound $W_{C,4}(e^{-SNR/2})-1$ for the fourth test scheme is better than the those for the first three test schemes. However, one should expect to pay a price in terms of decoding complexity in return for this improved performance.

The table below summarizes the key points of the above example by listing the minimum-distance terms and the SNR (dB) values required to achieve a union bound of 1E~5. The final column of the table shows the SNR gains relative to the benchmark scheme at the point where the union bound equals 1E−5. The ranking of the schemes with respect to SNR gain is correctly predicted by the minimum-distance term in the weight enumerator of the length-adapted code in each scheme.

constraint $0<A_S\leq\alpha$ for some fixed parameter $\alpha$. In the second preferred embodiment, we relax this assumption and allow $A_S$ to be a function of (A, E).

A third preferred embodiment of the present principles. According to the present principles, both the primary encoder and the secondary encoder must be length-adaptive encoders that can generate codewords in accordance with the length parameters assigned to them by the length-adapter 510. The third preferred embodiment of the present principles covers the case where either the primary encoder 530 or the secondary encoder 540 or both are embodiments of the present principles. In other words, in the third preferred embodiment, the primary codeword or the secondary codeword or both are generated by recursive length-adapted splitting and encoding in accordance with the present principles. Clearly, this type of recursive application of the present principles can be applied any number of times depending on the size of the codes involved.

A preferred method of decoding the length-adapted code. The person skilled in the art will note that the present principles are designed to enable decoding of the secondary code before the primary code by always requiring a non-empty secondary-only segment in the length-adapted codeword. A preferred method of decoding a length-adapted code generated in accordance with the present principles is as follows. The decoder may first generate a list of L candidates for the correct secondary codeword. For an ith candidate for the correct secondary codeword, the decoder may generate an ith candidate for the correct primary codeword by decoding the received word under the hypothesis that the ith candidate for the correct secondary codeword is indeed correct. Having thus generated a joint list of L candidates for the correct pair of primary and secondary codewords, the decoder may declare the most likely pair from the joint list as the final decoder decision. If $A_s$ is small, the list size may be $L=2^{A_P}$, allowing exhaustively trying all possible secondary codewords. The person skilled in the art will recognize that the above decoding method is just one example of many similar methods.

While the particular METHODS AND APPARATUS FOR LENGTH-ADAPTIVE ENCODING OF POLAR CODES is herein described in detail and is depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element,

|  | Primary code | Secondary code | Length-adapted code | SNR where union bound (UB) equals 1E−5 | SNR gain relative to benchmark scheme at UB = 1E−5 |
| --- | --- | --- | --- | --- | --- |
| Benchmark scheme | N/A | N/A | $2D^{11}$ | 4.44 | 0 |
| First test scheme | $27D^{12}$ | $30D^{32}$ | $53D^{12}$ | 4.26 | 0.18 |
| Second test scheme | $27D^{12}$ | $D^{24}$ | $28D^{12}$ | 4.14 | 0.31 |
| Third test scheme | $27D^{12}$ | $D^{26}$ | $27D^{12}$ | 4.13 | 0.32 |
| Fourth test scheme | $6D^{12}$ | $23D^{24}$ | $7D^{12}$ | 3.95 | 0.49 |

This completes the discussion of the first preferred embodiment. While the above examples of the first preferred embodiment have been restricted to specific codes and channels, the person skilled in the art will have no difficulty in applying the present principles to more general classes of codes and communication systems.

A second preferred embodiment of the present principles. In the first preferred embodiment, we assumed that for all $(A, E) \in \mathcal{A}_1$, the length-adapter 510 selects $A_S$ subject to the step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device,"

"unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A length-adaptive encoding method for use in a communication system, the method comprising:
receiving length-adapter input parameters and generating length-adapter output parameters, wherein the length-adapter input parameters comprise a data word length A and a length-adapted codeword length E, wherein the length-adapter output parameters comprise a primary data word length $A_P$, a secondary data word length $A_S$, a primary codeword length $E_P$, and a secondary codeword length $E_S$, wherein the data word length A and the length-adapted codeword length E are positive integers, wherein the length-adapter output parameters satisfy either a first set of the conditions or a second set of conditions, wherein the first set of conditions comprise $A_P \geq A/2$, $A_S > 0$, $A_P + A_S = A$, $0 < E_P \leq E$, $0 < E_S \leq E$, and $E_P + E_S > E$, and the second set of conditions comprise $A_P = A$, $A_S = 0$, $E_P = E$, and $E_S = 0$, wherein the first set of conditions are satisfied for a non-empty collection of the length-adapter input parameters;
receiving a data word and splitting the data word in accordance with splitter parameters into a primary data word and a secondary data word, wherein the splitter parameters comprise the primary data word length $A_P$ and the secondary data word length $A_S$;
encoding the primary data word in accordance with primary encoder parameters to generate a primary codeword from a primary code, wherein the primary encoder parameters comprise the primary data word length A, and the primary codeword length $E_P$;
encoding the secondary data word in accordance with secondary encoder parameters to generate a secondary codeword from a secondary code, wherein the secondary encoder parameters comprise the secondary data word length $A_S$ and the secondary codeword length $E_S$;
combining the primary codeword and the secondary codeword in accordance with combiner parameters to generate a length-adapted codeword and transmitting the length-adapted codeword via a channel to a decoder in the communication system, wherein the combiner parameters comprise the primary codeword length $E_P$, the secondary codeword length $E_S$, and the length-adapted codeword length E.

2. The method of claim 1, wherein the primary code is a polar code.

3. The method of claim 1, wherein the secondary code is a polar code.

4. The method of claim 2, wherein the primary codeword length $E_P$ equals a power of two.

5. The method of claim 3, wherein the secondary codeword length $E_S$ equals a power of two.

6. The method of claim 1, wherein the first set of conditions further comprise the condition $E_S = E$.

7. The method of claim 1, wherein the first set of conditions further comprise the conditions $0 < A_S \leq \alpha$ and $E_P \leq E - A_S$, wherein $\alpha$ is a preconfigured positive constant.

8. The method of claim 1, wherein the secondary data word length $A_S$ is a function of the data word length A and the length-adapted codeword length E.

9. The method of claim 1, wherein one of the primary codeword or the secondary codeword is generated by recursive length-adapted splitting and encoding.

10. The method of claim 1, wherein the combining the primary codeword and the secondary codeword comprises one or more interleaving operations, wherein the interleaving operations permute coordinates of the primary codeword or the secondary codeword or both.

11. An encoding apparatus for use in a communication system (300), the apparatus comprising:
a length-adapter, configured to receive length-adapter input parameters and generate length-adapter output parameters, wherein the length-adapter input parameters comprise a data word length A and a length-adapted codeword length E, wherein the length-adapter output parameters comprise a primary data word length $A_P$, a secondary data word length $A_S$, a primary codeword length $E_P$, and a secondary codeword length $E_S$, wherein the data word length A and the length-adapted codeword length E are positive integers, wherein the length-adapter output parameters satisfy either a first set of the conditions or a second set of conditions, wherein the first set of conditions comprise $A_P \geq A/2$, $A_S > 0$, $A_P + A_S = A$, $0 < E_P < E$, $0 < E_S \leq E$, and $E_P + E_S > E$, and the second set of conditions comprise $A_P = A$, $A_S = 0$, $E_P = E$, and $E_S = 0$, wherein the first set of conditions are satisfied for a non-empty collection of the length-adapter input parameters;
a splitter, configured to receive a data word and split the data word in accordance with splitter parameters into a primary data word and a secondary data word, wherein the splitter parameters comprise the primary data word length $A_P$ and the secondary data word length $A_S$;
a primary encoder, configured to encode the primary data word in accordance with primary encoder parameters to generate a primary codeword from a primary code, wherein the primary encoder parameters comprise the primary data word length $A_P$ and the primary codeword length $E_P$;
a secondary encoder, configured to encode the secondary data word in accordance with secondary encoder parameters to generate a secondary codeword from a secondary code, wherein the secondary encoder parameters comprise the secondary data word length $A_S$ and the secondary codeword length $E_S$;
a combiner, configured to combine the primary codeword and the secondary codeword in accordance with combiner parameters to generate a length-adapted codeword and transmit the length-adapted codeword via a channel to a decoder in the communication system, wherein the combiner parameters comprise the primary codeword length $E_P$, the secondary codeword length $E_S$, and the length-adapted codeword length E.

12. The apparatus of claim 11, wherein the primary code is a polar code.

13. The apparatus of claim 11, wherein the secondary code is a polar code.

14. The apparatus of claim 12, wherein the primary codeword length $E_P$ equals a power of two.

15. The apparatus of claim 13, wherein the secondary codeword length $E_S$ equals a power of two.

16. The apparatus of claim 11, wherein the first set of conditions further comprise the condition $E_S = E$.

17. The apparatus of claim 11, wherein the first set of conditions further comprise the conditions $0 < A_S \leq \alpha$ and $E_P \leq E - A_S$, wherein a is a preconfigured positive constant.

18. The apparatus of claim 11, wherein the secondary data word length $A_S$ is a function of the data word length A and the length-adapted codeword length E.

19. The apparatus of claim 11, wherein one of the primary codeword or the secondary codeword is generated by recursive application of length-adapted splitting and encoding.

20. The apparatus of claim 11, wherein the combiner comprises interleaving operations, wherein the interleaving operations permute coordinates of the primary codeword or the secondary codeword or both.

* * * * *